United States Patent
Yoo et al.

(10) Patent No.: US 9,806,080 B2
(45) Date of Patent: Oct. 31, 2017

(54) SEMICONDUCTOR DEVICES AND METHODS OF MANUFACTURING THE SAME

(71) Applicant: SAMSUNG ELECTRONICS CO., LTD., Suwon-si, Gyeonggi-Do (KR)

(72) Inventors: Han-Sik Yoo, Seoul (KR); Hyuk-Joon Kwon, Yongin-si (KR); Jung-Ha Oh, Gwacheon-si (KR); Jun-Ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/731,764

(22) Filed: Jun. 5, 2015

(65) Prior Publication Data

US 2015/0364474 A1 Dec. 17, 2015
US 2017/0263610 A9 Sep. 14, 2017

(30) Foreign Application Priority Data

Jun. 11, 2014 (KR) .................. 10-2014-0070959

(51) Int. Cl.
*H01L 27/108* (2006.01)
*H01L 29/94* (2006.01)
(Continued)

(52) U.S. Cl.
CPC .... *H01L 27/10823* (2013.01); *G06F 11/1048* (2013.01); *G11C 11/5635* (2013.01);
(Continued)

(58) Field of Classification Search
USPC ...... 257/68–71, 296–309, E27.084–E27.097, 257/E27.075, 295, E21.646–E21.66,
(Continued)

(56) References Cited

U.S. PATENT DOCUMENTS 6,821,846 B2 11/2004 Shao et al.
7,329,918 B2 2/2008 Cho et al.
(Continued)

FOREIGN PATENT DOCUMENTS

KR  0310256 B  9/2001
KR  0444773 B  8/2004
(Continued)

*Primary Examiner* — Tram H Nguyen
(74) *Attorney, Agent, or Firm* — Volentine & Whitt, PLLC

(57) ABSTRACT

A semiconductor device includes a substrate, a memory structure and a capacitor structure including at least one array of capacitors. The memory structure is disposed in a first region of the device. The capacitor structure is disposed in a second region of the device. The capacitor structure may include a first capacitor array, a second capacitor array, a third capacitor array and a first landing pad. The first landing pad is disposed between the substrate and lower electrodes of capacitors of the first and second capacitor arrays, and contacts the lower electrodes so as to electrically connect the first capacitor array and the second capacitor array. Upper electrodes of capacitors of the second and third capacitor arrays are integral such that the second capacitor array and the third capacitor array are electrically connected to each other.

20 Claims, 22 Drawing Sheets

(51) Int. Cl.
  *G11C 11/56* (2006.01)
  *G11C 29/52* (2006.01)
  *H01L 23/528* (2006.01)
  *H01L 49/02* (2006.01)
  *G11C 16/04* (2006.01)
  *G06F 11/10* (2006.01)
  *G11C 29/42* (2006.01)
  *G11C 29/04* (2006.01)
  *H01L 27/11582* (2017.01)

(52) U.S. Cl.
  CPC ...... *G11C 11/5671* (2013.01); *G11C 16/0466* (2013.01); *G11C 29/52* (2013.01); *H01L 23/528* (2013.01); *H01L 27/10814* (2013.01); *H01L 28/40* (2013.01); *G11C 29/42* (2013.01); *G11C 2029/0411* (2013.01); *H01L 27/11582* (2013.01); *H01L 2924/0002* (2013.01)

(58) Field of Classification Search
  USPC ... 257/E27.098–E27.101, E27.077, E21.661, 257/E43.001–E43.007, E27.005–E27.006, 257/E27.008, E29.164, E29.167, E29.272, 257/E29.323; 438/3, 785, E21.208; 365/158, 171, 173, 55
  See application file for complete search history.

(56) References Cited

U.S. PATENT DOCUMENTS

| | | | |
|---|---|---|---|
| 7,582,925 | B2 | 9/2009 | Jung et al. |
| 7,952,130 | B2 | 5/2011 | Arai |
| 8,125,010 | B2 | 2/2012 | Mizushima |
| 8,258,574 | B2 | 9/2012 | Han |
| 8,436,408 | B2 | 5/2013 | Tu et al. |
| 8,847,353 | B2 * | 9/2014 | Hasunuma .......... H01L 27/0207 257/307 |
| 2006/0289932 | A1 | 12/2006 | Ahn et al. |
| 2010/0219502 | A1 | 9/2010 | Shieh et al. |
| 2010/0320521 | A1 * | 12/2010 | Izumi .............. H01L 27/10814 257/306 |
| 2011/0284991 | A1 * | 11/2011 | Hijioka ............ H01L 23/5223 257/532 |
| 2012/0061800 | A1 * | 3/2012 | Hirota ................ H01L 28/75 257/532 |
| 2012/0256243 | A1 * | 10/2012 | Atou ............... H01L 27/0207 257/296 |
| 2013/0242643 | A1 * | 9/2013 | Kim ..................... G11C 5/14 365/149 |

FOREIGN PATENT DOCUMENTS

| KR | 0651583 B1 | 11/2006 |
|---|---|---|
| KR | 0688554 B | 2/2007 |
| KR | 20100042462 A | 4/2010 |

* cited by examiner

FIG. 4
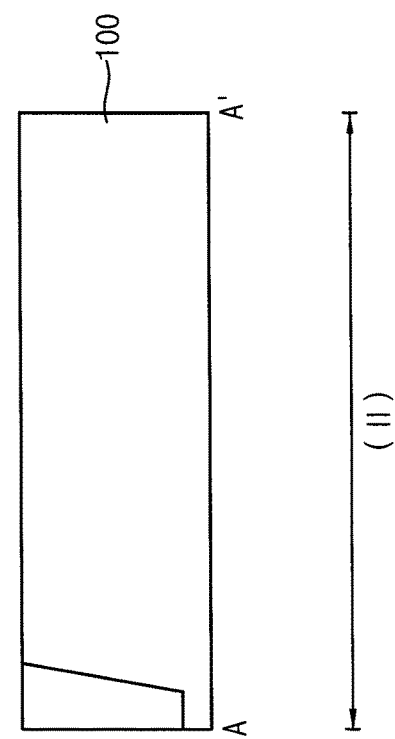
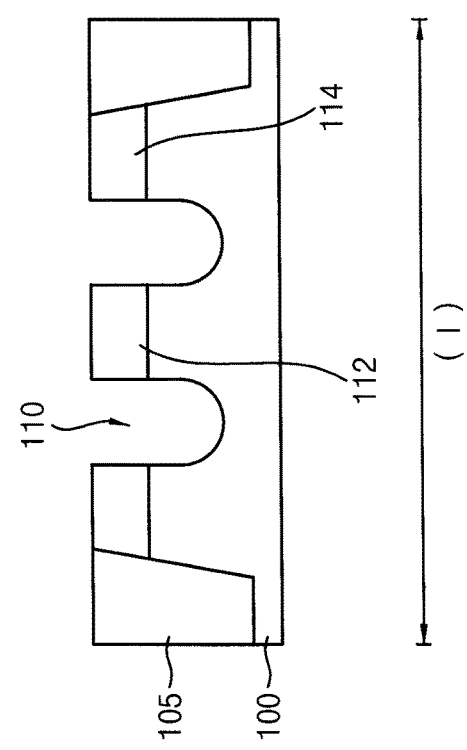

FIG. 16
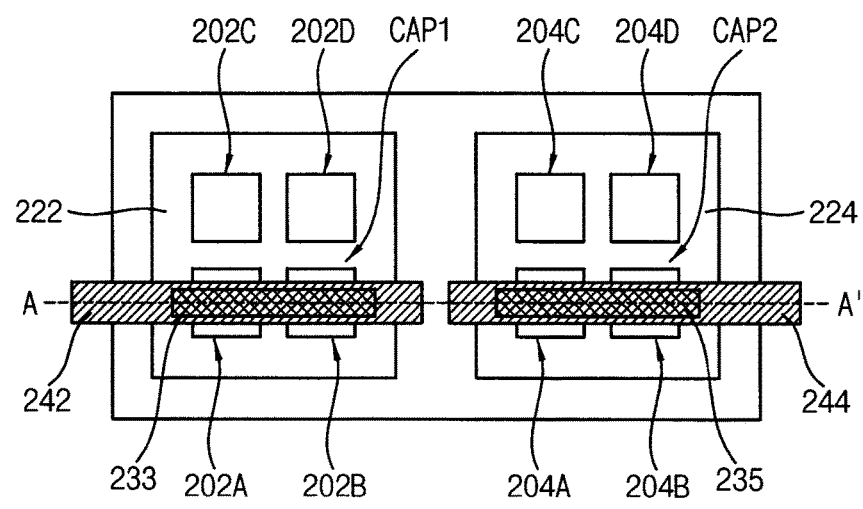
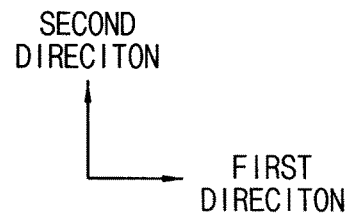

SEMICONDUCTOR DEVICES AND METHODS OF MANUFACTURING THE SAME

PRIORITY STATEMENT

This application claims priority under 35 U.S.C §119 to Korean Patent Application No. 10-2014-0126981 filed on Sep. 23, 2014 in the Korean Intellectual Property Office, the disclosure of which is hereby incorporated by reference in its entirety.

BACKGROUND

1. Field

Exemplary embodiments relate to semiconductor devices and methods of manufacturing the same. More particularly, exemplary embodiments relate to semiconductor devices including decoupling capacitors and methods of manufacturing the same.

2. Description of the Related Art

Recently, as semiconductor memory devices become more highly integrated, their operation speed has also increased. Increasing the clock frequency to increase the operation speed may also result in increased signal noise between the power signals such as power voltage Vdd and ground voltage Vss during a read operation and a write operation. A capacitance is used as a noise filter to obviate this problem.

SUMMARY

An exemplary embodiment of the present inventive concept is a semiconductor device including a substrate spanning a first region and a second region of the device, a memory structure disposed in the first region, and a capacitor structure disposed in the second region, and in which the capacitor structure comprises a first capacitor array of a plurality of first capacitors each having a lower electrode, a dielectric layer pattern and an upper electrode, a second capacitor array of a plurality of second capacitors each having a lower electrode, a dielectric layer pattern and an upper electrode, a third capacitor array of a plurality of third capacitors each having a lower electrode, a dielectric layer pattern and an upper electrode; and a first landing pad interposed between the substrate and the lower electrodes of the first and second capacitors, contacting the lower electrodes of each of the first and second capacitors, and electrically connecting the first capacitors and the second capacitors to one another, and in which the upper electrodes of the second and third capacitors are integral such that the second capacitors and the third capacitors are electrically connected to each other.

Another exemplary embodiment of the present inventive concept is a semiconductor device including a substrate spanning a first region and a second region of the device, a memory structure disposed in the first region, and a capacitor structure disposed in the second region, and in which the capacitor structure comprises a first capacitor array of a plurality of first capacitors each having a lower electrode, a dielectric layer pattern and an upper electrode, a second capacitor array of a plurality of second capacitors each having a lower electrode, a dielectric layer pattern and an upper electrode, and a first landing pad interposed between the substrate and the lower electrodes of the first and second capacitors, contacting the lower electrodes of the first and second capacitors, and electrically connecting the first capacitors array and the second capacitors to one another.

Another exemplary embodiment of the present inventive concept is a semiconductor device including a substrate spanning a first region and a second region of the device, a first interlayer insulating layer disposed in the substrate and spanning the first and second regions of the device, a memory structure comprising at least one memory element disposed in the first region, and a capacitor structure disposed in the second region, and in which the capacitor structure comprises an array of capacitors each extending vertically in the interlayer insulating layer in the second region, the capacitors having discrete lower electrodes, respectively, a common upper electrode, and discrete dielectric layer patterns each interposed between a respective one of the lower electrodes and the common upper electrode, a pad of electrically conductive material interposed between the substrate and the lower electrodes of the capacitors of the array, and contacting the lower electrodes of the capacitors, a second interlayer insulating layer disposed on the first interlayer insulating layer, first and second wirings disposed on the second interlayer insulating layer, and first and second contacts extending from the first and second wirings, respectively, into the second interlayer insulating layer, and in which the common upper electrode of the capacitors comprises vertical columns of electrically conductive material each surrounded by a respective one of the dielectric layer patterns, and a layer of conductive material extending on an upper surface of the interlayer insulating layer and connecting the vertical columns of electrically conductive material to one another, the first contact is electrically connected to the capacitor array at the common upper electrode, and the second contact is electrically connected to the capacitor array at the lower electrodes via the landing pad.

BRIEF DESCRIPTION OF THE DRAWINGS

Exemplary embodiments will be more clearly understood from the following detailed description taken in conjunction with the accompanying drawings.

FIGS. 4, 5, 6, 7, 8, 9, 10 and 11 are cross-sectional views illustrating a method of manufacturing a semiconductor device in accordance with some exemplary embodiments;

FIG. 16 is a plan view of a capacitor structure of a fourth embodiment of a semiconductor device in accordance with the inventive concept;

DETAILED DESCRIPTION OF THE PREFERRED EMBODIMENTS

Figure 1:
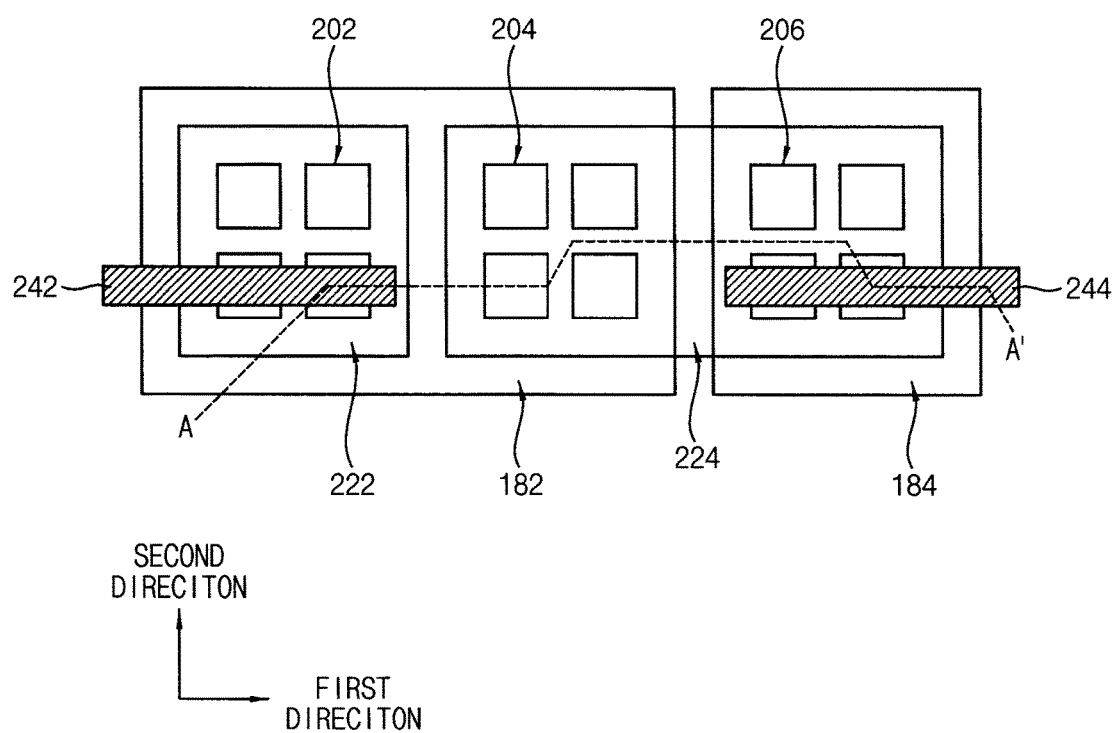
FIG. 1 is a plan view of a capacitor structure of a first embodiment of a semiconductor device in accordance with the inventive concept.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, the term "extend" will generally be understood to reference a lengthwise or longitudinal direction of the particular element or feature being described even if not explicitly stated.

An embodiment of a semiconductor device in accordance with the inventive concept will now be described with reference to FIGS. 1-3.

Figure 2:
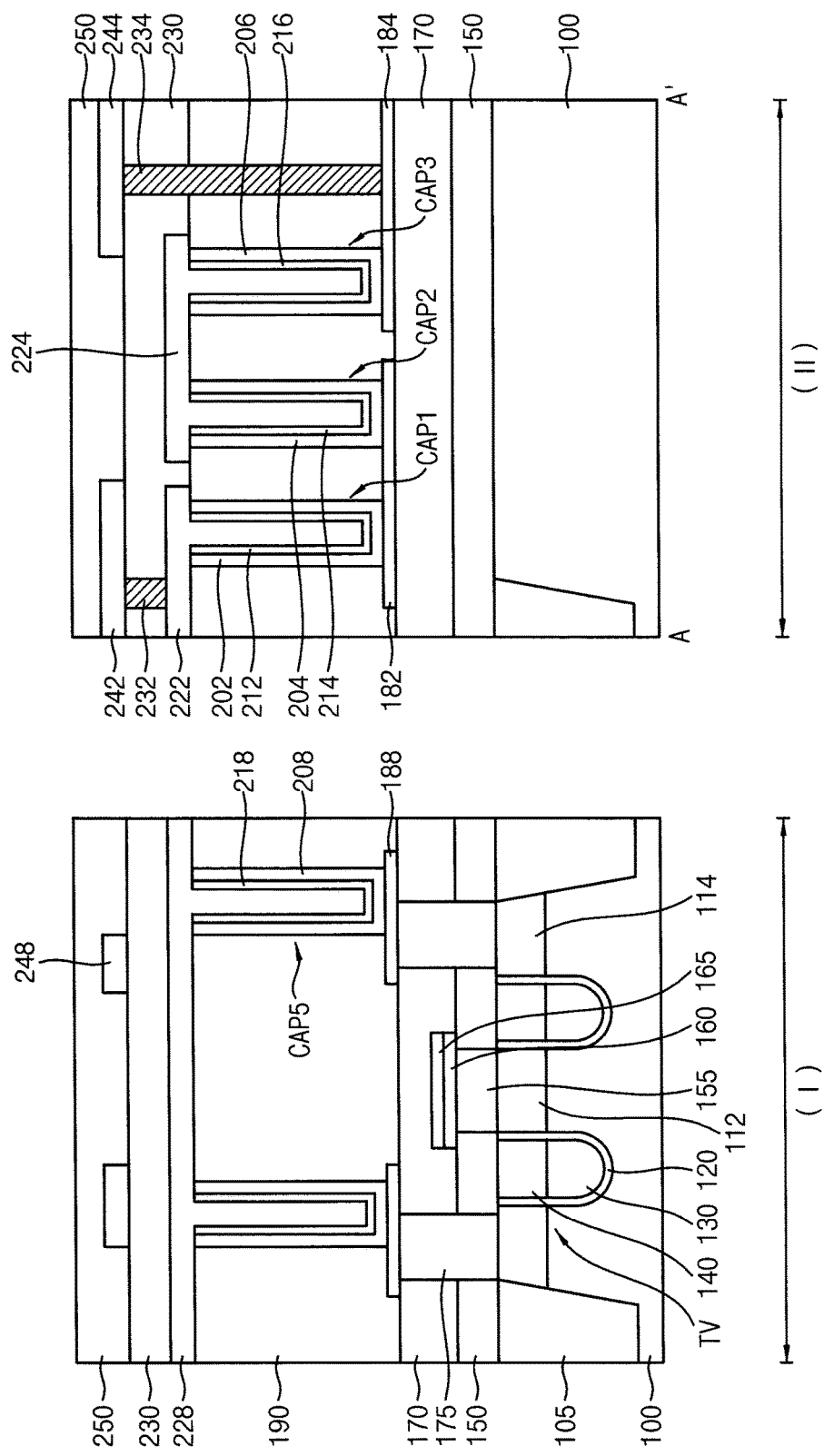
FIG. 2 illustrates the first embodiment of the semiconductor device and comprises a cross-sectional view taken along line A-A' of FIG. 1 and a cross-sectional view taken along a cell region of the semiconductor device.

Referring first to FIGS. 1 and 2, the semiconductor device may have a first region (I) and a second region (II), and comprise a memory structure disposed in the first region (I) and a capacitor structure disposed in the second region (II). In exemplary embodiments, the first region (I) may be a cell region where the memory structure (that is, a memory cell)

is disposed, and the second region (II) may be a peripheral region where circuits and wirings are disposed.

The semiconductor device also has a substrate 100 extending across the first and second regions (I) and (II). The substrate 100 may comprise a semiconductor substrate. For example, the substrate 100 may comprise a silicon substrate, a germanium substrate, a silicon-germanium substrate, a silicon-on-insulator (SOI) substrate, a germanium-on-insulator (GOI) substrate, or the like.

Furthermore, an isolation layer 105 may be disposed at an upper portion of the substrate 100. The isolation layer 105 may divide the device into a field region including the isolation layer 105 and an active region excluding the isolation layer 105. In an exemplary embodiment, the isolation layer 105 may comprise a silicon oxide and/or a silicon nitride.

Referring to FIG. 2, the memory structure in the first region (I) may be, for example, a dynamic random access memory (DRAM) structure. That is, the memory structure may comprise a transistor (Tr) and a capacitor (Cap). The transistor (Tr) may include a gate structure and impurity regions 112 and 114 buried at an upper portion of the substrate 100.

The gate structure may comprise a gate insulation layer pattern 120, a gate electrode 130 and a gate mask 140. In this case, the gate insulation layer pattern 120 may be formed on an inner wall of a trench which may be formed by partially removing an upper portion of the substrate 100. The gate electrode 130 may be disposed on the gate insulation layer pattern 120 to fill a lower portion of the trench, and the gate mask 140 may be disposed on the gate electrode 130 to fill an upper portion of the trench.

On the other hand, the impurity regions 112 and 114 may be disposed at the upper portion of the substrate 100 on opposite sides of the gate structure. As shown in the figure, the first impurity region 112 may be disposed between and shared by two gate structures, and the second impurity region 114 may be disposed on sides of the gate structure opposite the sides between which the first impurity region 112 extends.

A first insulating interlayer 150 may be disposed in the first region (I) and the second region (II). In particular, the first insulating interlayer 150 may cover the isolation layer 105 and the transistor (Tr). The first insulating interlayer 150 comprises an insulation material such as silicon oxide.

The bit line 160 may be disposed on the first insulating interlayer 150. The bit line 160 may extend in a direction substantially parallel to a top surface of the substrate 100. Furthermore, the bit line 160 may be electrically connected to the first impurity region 112 by a first contact 155 passing through the first insulating interlayer 150. That is, the bit line 160 may be electrically connected to a pair of the transistors (Tr) by the first contact 155. Furthermore, a bit line mask 165 including an insulation material may be disposed on the bit line 160.

A second insulating interlayer 170 may be disposed in the first region (I) and the second region (II). In particular, the second insulating interlayer 170 may cover the bit line 160 and the bit line mask 170 on the first insulating interlayer 150. The second insulating interlayer 170 comprises insulation material such as silicon oxide.

A fourth landing pad 188 may be disposed on the second insulating interlayer 170 in the first region (I). The fourth landing pad 188 may be electrically connected to the second impurity region 144 by a second contact 175 passing through the first insulating interlayer 150 and the second insulating interlayer 170. The fourth landing pad 188 may electrically connect the transistors (Tr) with the capacitor (Cap) described in more detail below. The fourth landing pad 188 may have a planar (surface) area greater than the planar (surface) area of the second contact 175, when viewed from a direction substantially perpendicular to a top surface of the substrate 100. Therefore, the fourth landing pad 188 may prevent an electrical failure due to a misalignment between the second contact 175 and the capacitor (Cap).

In exemplary embodiments, the fourth landing pad 188 comprises a metal or conductive polysilicon.

A cell capacitor (Cap) may penetrate a third insulating interlayer 190 on the fourth landing pad 188. The cell capacitor (Cap) may comprise a fifth lower electrode 208, a fifth dielectric layer pattern 218 and a fifth upper electrode 228.

The fifth lower electrode 208 may be disposed on the fourth landing pad 188. The fifth lower electrode 208 may extend in a direction substantially perpendicular to the top surface of the substrate 100. In exemplary embodiments, the fifth lower electrode 208 may have a cylinder shape in which a central portion is empty. Alternatively, the fifth lower electrode 208 may have a pillar shape extending in the direction substantially perpendicular to the top surface of the substrate 100. The fifth electrode 208 may comprise a metal, a metal nitride or conductive polysilicon.

The fifth dielectric layer pattern 218 may be disposed on the fifth lower electrode 208. In exemplary embodiments, the fifth dielectric layer pattern 218 may be disposed on an inner wall and/or an outer wall of the fifth lower electrode 208. The fifth dielectric layer pattern 218 may comprise a silicon oxide (SiOx), silicon nitride (SiNx), aluminum oxide (AlOx), hafnium oxide (HfOx), tantalum oxide (TaOx), titanium oxide (TiOx), zirconium oxide (ZrOx), or a mixture thereof.

The fifth upper electrode 228 may be disposed on the fifth dielectric layer pattern 218. The fifth upper electrode 228 may comprise a metal, a metal nitride or conductive polysilicon.

The cell capacitor including the fifth lower electrode 208, the fifth dielectric layer pattern 218 and the fifth upper electrode 228 may serve to store an electrical charge.

Referring still to FIGS. 1 and 2, the capacitor structure passing through the third insulating interlayer 190 may be disposed in the second region (II). The capacitor structure may comprise landing pads 182 and 184, lower electrodes 202, 204 and 206, dielectric layer patterns 212, 214 and 216, upper electrodes 222 and 224 and wirings 242 and 244.

The first and second landing pads 182 and 184 may be disposed on the second insulating interlayer 170 in the second region (II). That is, the first and second landing pads 182 and 184 may be disposed at the same level as that of the fourth landing pad 188 in the first region (I). Furthermore, the first and second landing pads 182 and 184 may comprise a material identical to that of the fourth landing pad 188.

The first and second landing pads 182 and 184 may have a plate shape such that thicknesses of the first and second landing pads 182 and 184 may be smaller than lengths or widths of the first and second landing pads 182 and 184. The first and second landing pads 182 and 184 may be spaced apart from each other in a first direction substantially parallel to the top surface of the substrate 100. That is, the first and second landing pads 182 and 184 may not directly contact each other. Furthermore, bottom surfaces of the first and second landing pads 182 and 184 may be disposed directly on the second insulating interlayer 170 and the first and second landing pads 182 and 184 may be completely spanned by the second insulating interlayer 170. In this case, therefore, the first and second landing pads 182 and 184 are not electrically connected to any other conductive pattern or material disposed below the first and second landing pads 182 and 184 whereas the fourth landing pad 188 may be electrically connected to the second contact 175 disposed below the fourth landing pad 188.

The lower electrodes 202, 204 and 206 may be disposed on the landing pads 182 and 184. In exemplary embodiments, a plurality of first lower electrodes 202 may be arranged in the first direction and a second direction substantially perpendicular to the first direction, thereby forming a first lower electrode array. Furthermore, a plurality of second lower electrodes 204 may be arranged in the first direction and the second direction, thereby forming a second lower electrode array, and a plurality of third lower electrodes 206 may be arranged in the first direction and the second direction, thereby forming a third lower electrode array. Each of the lower electrode arrays may comprise at least four lower electrodes. For example, each of the lower electrode arrays may comprise five to twenty five lower electrodes.

In the illustrated embodiment, the first lower electrodes 202 and the second lower electrodes 204 are disposed directly on the first landing pad 182, and the third lower electrodes 206 are disposed on the second landing pad 184. Accordingly, the first landing pad 182 may contact the first lower electrodes 202 and the second lower electrodes 204, so that the first landing pad 182 may minimize an electrical resistance between the first lower electrodes 202 and the second lower electrodes 204.

In exemplary embodiments, each of the lower electrodes 202, 204 and 206 is square (i.e., has a square contour) when viewed in plan, i.e., in a direction substantially perpendicular to the top surface of the substrate 100, as illustrated in FIG. 1; however, the present invention is not limited thereto. For example, each of the lower electrodes 202, 204 and 206 may be circular, elliptical, or polygonal, when viewed in the direction substantially perpendicular to the top surface of the substrate 100.

The dielectric layer patterns 212, 214 and 216 may be disposed on the lower electrodes 202, 204 and 206, respectively. The dielectric layer patterns 212, 214 and 216 may comprise a material which may be identical to that of the fifth dielectric layer pattern 218. Furthermore, each of the dielectric layer patterns 212, 214 and 216 may have a structure identical to that of the fifth dielectric layer pattern 218.

The upper electrodes 222 and 224 may be disposed on the dielectric layer patterns 212, 214 and 216. The first upper electrode 222 and the second upper electrode 224 may be spaced apart from each other in the first direction. Furthermore, the first upper electrode 222 and the second upper electrode 224 may be associated with respective ones of the lower electrodes 202, 204 and 206. For example, the first upper electrode 222 may overlap the first lower electrodes 202, and the second upper electrode 224 may overlap the second lower electrodes 204 and the third lower electrodes 206.

Therefore, the first lower electrodes 202, the first dielectric layer patterns 212 and the first upper electrode 222 may constitute a first capacitor array (CAP1). The second lower electrodes 204, the second dielectric layer patterns 214 and the second upper electrode 224 may constitute a second capacitor array (CAP2), and the third lower electrodes 206, the third dielectric layer patterns 216 and the second upper electrode 224 may constitute a third capacitor array (CAP3).

Note, in this respect, the upper electrodes 224 of the capacitors of the second capacitor array (CAP2) and the third capacitor array (CAP3) are integral and in this example, are unitary.

Figure 3:
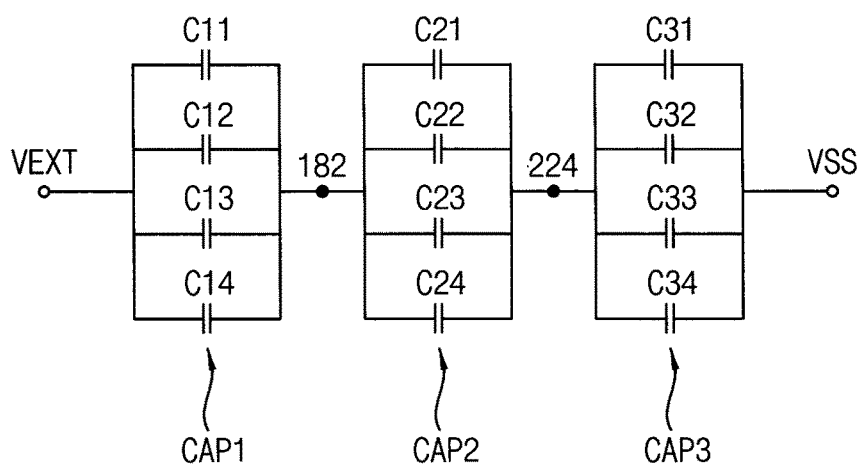
FIG. 3 is a circuit diagram of a capacitor structure of the semiconductor device in accordance with the inventive concept.

Referring to FIG. 3, the capacitors may be electrically connected to each other, thereby constituting the capacitor structure.

Capacitors (C11, C12, C13, C14) constituting the first capacitor array (CAP1) may be electrically connected to each other in parallel, capacitors (C21, C22, C23, C24) constituting the second capacitor array (CAP2) may be electrically connected to each other in parallel, and capacitors (C31, C32, C33, C34) constituting the third capacitor array (CAP3) may be electrically connected to each other in parallel.

Furthermore, the first capacitor array (CAP1) and the second capacitor array (CAP2) may be electrically connected by the first landing pad 182, and the second capacitor array (CAP2) and the third capacitor array (CAP3) may be electrically connected by the second upper electrode 224.

The fourth insulating interlayer 230 may be disposed on the third insulating interlayer 190 to cover the upper electrodes 222 and 224. In exemplary embodiments, the fourth insulating interlayer 230 comprises an insulation material such as a silicon oxide.

The wirings 242 and 244 may be disposed on the fourth insulating interlayer 230. In exemplary embodiments, the first wiring 242 may be electrically connected to the upper electrode 222 by a third contact 232 passing through the fourth insulating interlayer 230, and the second wiring 244 may be electrically connected to the second landing pad 184 by a fourth contact 234 passing through the second insulating interlayer 190 and the fourth insulating interlayer 230. Therefore, the first to third capacitor arrays (CAP1, CAP2 and CAP3) may be electrically connected in series between the first wiring 242 and the second wiring 244.

Furthermore, a protection layer 250 may be disposed on the fourth insulating interlayer 230 to cover the wirings 242 and 244.

In an exemplary embodiment, a relatively high voltage (Vext) may be applied to the first wiring 242, and a relatively low voltage (VSS) may be applied to the second wiring 244.

Each of the capacitor arrays (CAP1, CAP2, CAP3) may be directly connected by the first landing pad 182 or the integral second upper electrode 224, so that an electrical resistance between the capacitor arrays (CAP1, CAP2, CAP3) may be reduced, and the capacitor structure may have an improved effective capacitance.

In exemplary embodiments, the capacitor structure may comprise the first to third capacitor arrays as illustrated in FIGS. 1 to 3. However, the inventive concept may not be limited thereto. For example, the capacitor structure may comprise any odd number of capacitor arrays (e.g., 5, 7, 9 . . . ) adjacent ones of which are alternately and repeatedly connected by a landing pad and an upper electrode.

FIGS. 4 to 11 are cross-sectional views illustrating a method of manufacturing a semiconductor device in accordance with some exemplary embodiments.

Referring to FIG. 4, an isolation layer 105 may be formed at an upper portion of a substrate 100, and a trench 110 may be formed by partially removing the substrate 100.

The substrate 100 may comprise a semiconductor substrate. For example, the substrate 100 may comprise a silicon substrate, a germanium substrate, a silicon-germanium substrate, a silicon-on-insulator (SOI) substrate, a germanium-on-insulator (GOI) substrate, or the like.

The substrate 100 may span a first region (I) and second region (II) of the device under manufacture. In exemplary embodiments, the first region (I) may be a cell region where the memory structure (that is, a memory cell) may be disposed, and the second region (II) may be a peripheral region where circuits and wirings may be disposed.

The upper portion of the substrate 100 may be partially removed to form a recess, and the isolation layer 105 of a silicon oxide and/or a silicon nitride may be formed to fill the recess. Therefore, the substrate 100 may be divided into a field region including the isolation layer 105 and an active region excluding the isolation layer 105.

Then, a hard mask may be formed on the substrate 100, and the trench 110 may be formed in the first region (I) by an etching process using the hard mask. In exemplary embodiments, a pair of trenches 110 may be formed in each (i.e., in a single) active region.

Also, impurities may be implanted into an upper portion of the substrate 100, before or after forming the trench 110. Therefore, a first impurity region 112 and a second impurity region 114 may be formed at the upper portion of the substrate 100.

Figure 5:
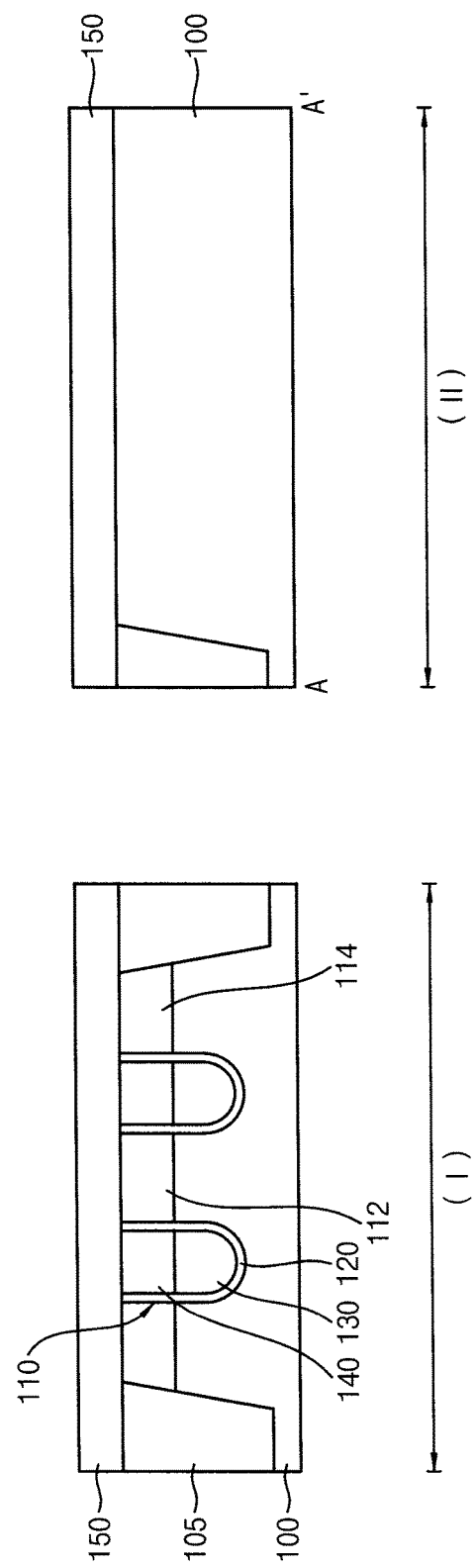

Referring to FIG. 5, a gate structure may be formed in the trench 110.

In particular, a gate insulation layer and a gate electrode layer may be formed sequentially on the substrate 100 and the isolation layer 105 to fill the trench 110, and then the gate insulation layer and the gate electrode layer may be partially removed by a chemical mechanical planarization (CMP) process or an etch back process, thereby forming a gate insulation layer pattern 120 and a gate electrode 130.

In exemplary embodiments, the gate insulation layer may be formed of a silicon oxide or a silicon nitride by thermally oxidizing an upper surface of the substrate 100 exposed by the trench 110, or by an atomic layer deposition (ALD) process or a chemical vapor deposition (CVD). Furthermore, the gate electrode layer may be formed of a metal or a metal nitride, such as tungsten (W), tantalum nitride (TaN), titanium nitride (TiN), or tungsten nitride (WN), by a physical vapor deposition (PVD) process, an ALD process, or a sputtering process, for example.

Then, a gate mask layer may be formed on the substrate 100 and the isolation layer 105 to fill a remaining portion of the trench 110, and an upper portion of the gate mask layer may be removed by a CMP process and/or an etch back process. In exemplary embodiments, the gate mask layer may be formed of a silicon nitride or a silicon oxynitride.

Therefore, the gate structure may be constituted by the gate insulation layer 120, the gate electrode 130 and the gate mask 140.

Next, a first insulating interlayer 150 may be formed on the substrate 100, the isolation layer 105 and the gate structure.

Figure 6:
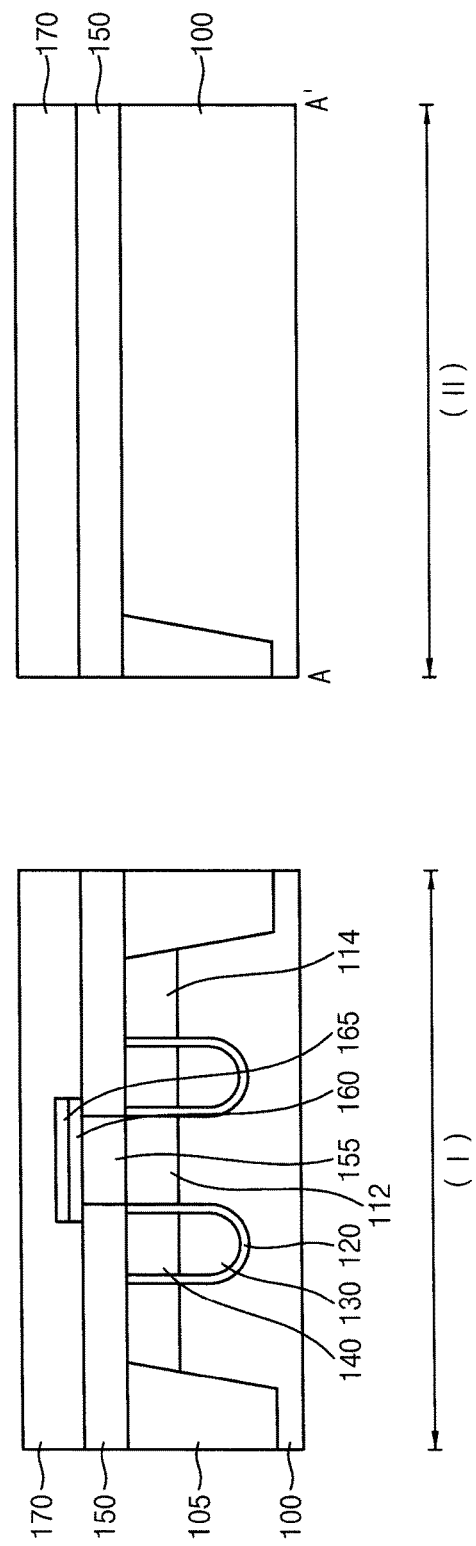

Referring to FIG. 6, a first contact 155 may be formed through the first insulating interlayer 150, and a bit line 160 may be formed on the first contact 155 and the first insulting interlayer 150.

More specifically, a contact hole exposing the first impurity region 112 may be formed by partially removing the first insulating interlayer 150, and then the first contact 155 may be formed to fill the contact hole. In exemplary embodiment, the first contact 155 may be electrically connected to the first impurity region 112.

Then, a bit line layer and a bit line mask layer may be sequentially formed on the first insulating interlayer 150 and the first contact 155, and the bit line layer and the bit line mask layer may be patterned to form the bit line 160 and the bit line mask 165.

Furthermore, a second insulating interlayer 170 may be formed on the first insulating interlayer 150 to cover the bit line 160 and the bit line mask 165.

Figure 7:
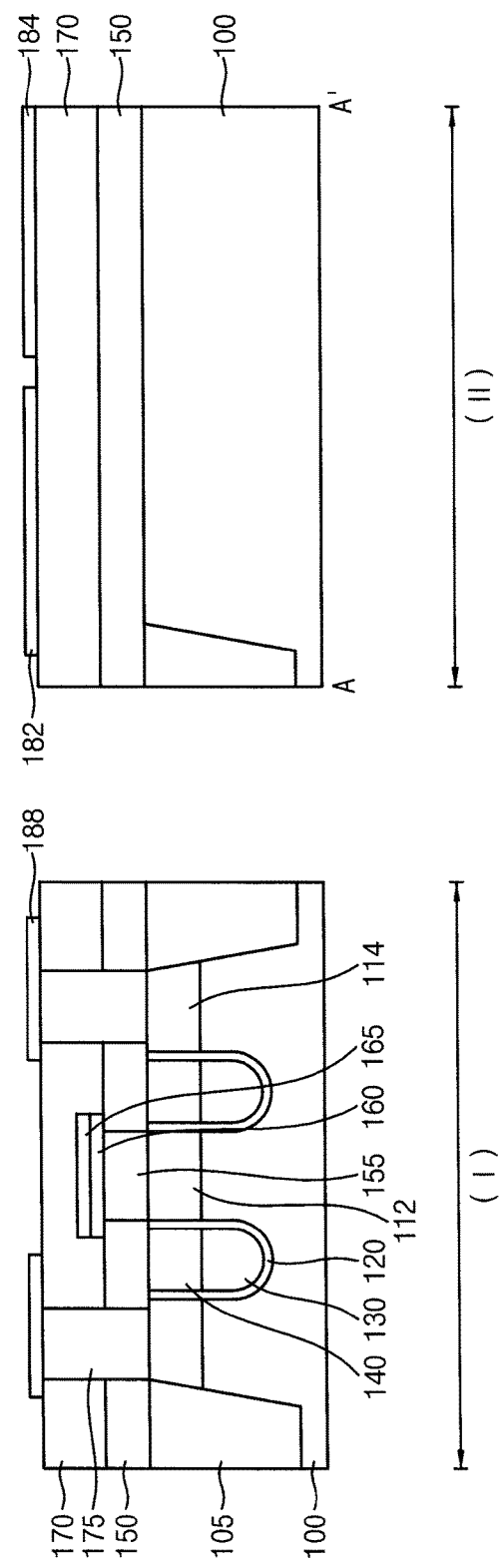

Referring to FIG. 7, a second contact 175 may be formed through the first insulating interlayer 150 and the second insulating interlayer 170, and then conductive landing pads 182, 184 and 188 may be formed.

More specifically, a contact hole exposing the second impurity region 114 may be formed by partially removing the first insulating interlayer 150 and the second insulating interlayer 170, and then the second contact 175 may be formed to fill the contact hole. In exemplary embodiments, the second contact 175 may be electrically connected to the second impurity region 114.

Then, the landing pads 182, 184 and 188 may be formed on the second insulating interlayer 170 and the second contact 175. In exemplary embodiments, a landing pad layer may be formed on the second insulating interlayer 170 and the second contact 175 in the first region (I) and the second region (II), and then the landing pad layer may be partially removed to form the first landing pad 182, the second landing pad 184 and the fourth landing pad 188, simultaneously.

In exemplary embodiments, the fourth landing pad 188 may directly contact the second contact 175 in the first region (I). At this time, bottom surfaces of the first landing pad 182 and the second landing 184 may be covered completely by the second insulating interlayer 170.

Figure 8:
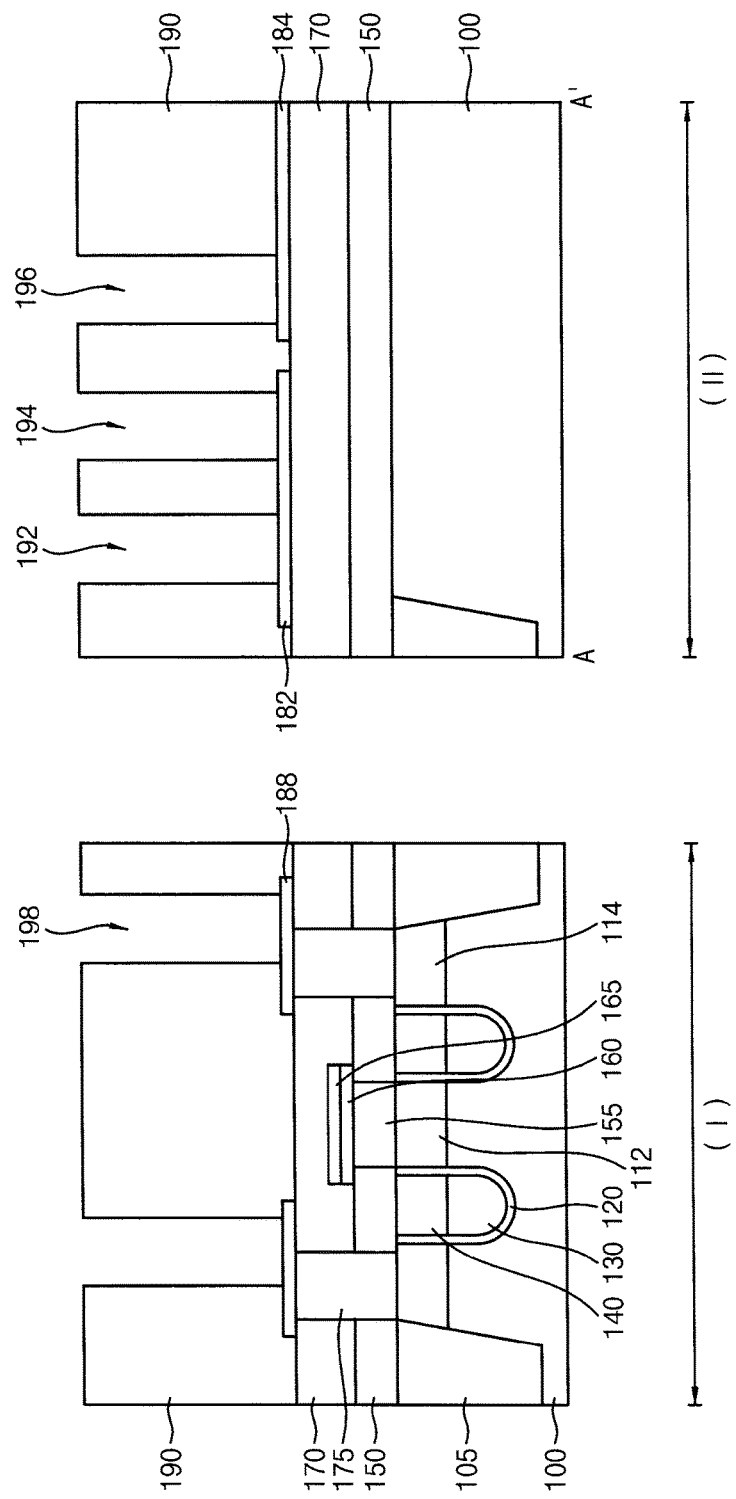

Referring to FIG. 8, a third insulating interlayer 190 may be formed on the second insulating interlayer 170 and the landing pads 182, 184 and 188, and holes 192, 194, 196 and 198 may be formed by partially removing the third insulating interlayer 190.

The holes 192, 194, 196 and 198 may pass through the third insulating interlayer 190, and may partially expose the landing pads 192, 194 and 188, respectively.

In exemplary embodiments, the first holes 192 and the second holes 194 may partially expose a top surface of the first landing pad 182, the third holes 196 may partially expose a top surface of the second landing pad 184, and the fourth holes 198 may partially expose a top surface of the fourth landing pad 188.

In exemplary embodiments, a plurality of first holes 192 may be arranged in a first direction and a second direction which may be substantially parallel to a top surface of the substrate 100, a plurality of second holes 194 may be arranged in the first direction and the second direction, and a plurality of third holes 196 may be arranged in the first direction and second direction. That is, the plurality of first holes 192 may constitute a first hole array, the plurality of second holes 194 may constitute a second hole array, and the plurality of third holes 196 may constitute a third hole array.

In exemplary embodiments, each of the holes 192, 194, 196 and 198 may have a square cross section, a circular cross section, an elliptical cross section, or a polygonal cross section, i.e., may be square, circular, elliptical or polygonal when viewed in a direction substantially perpendicular to the top surface of the substrate 100.

Figure 9:
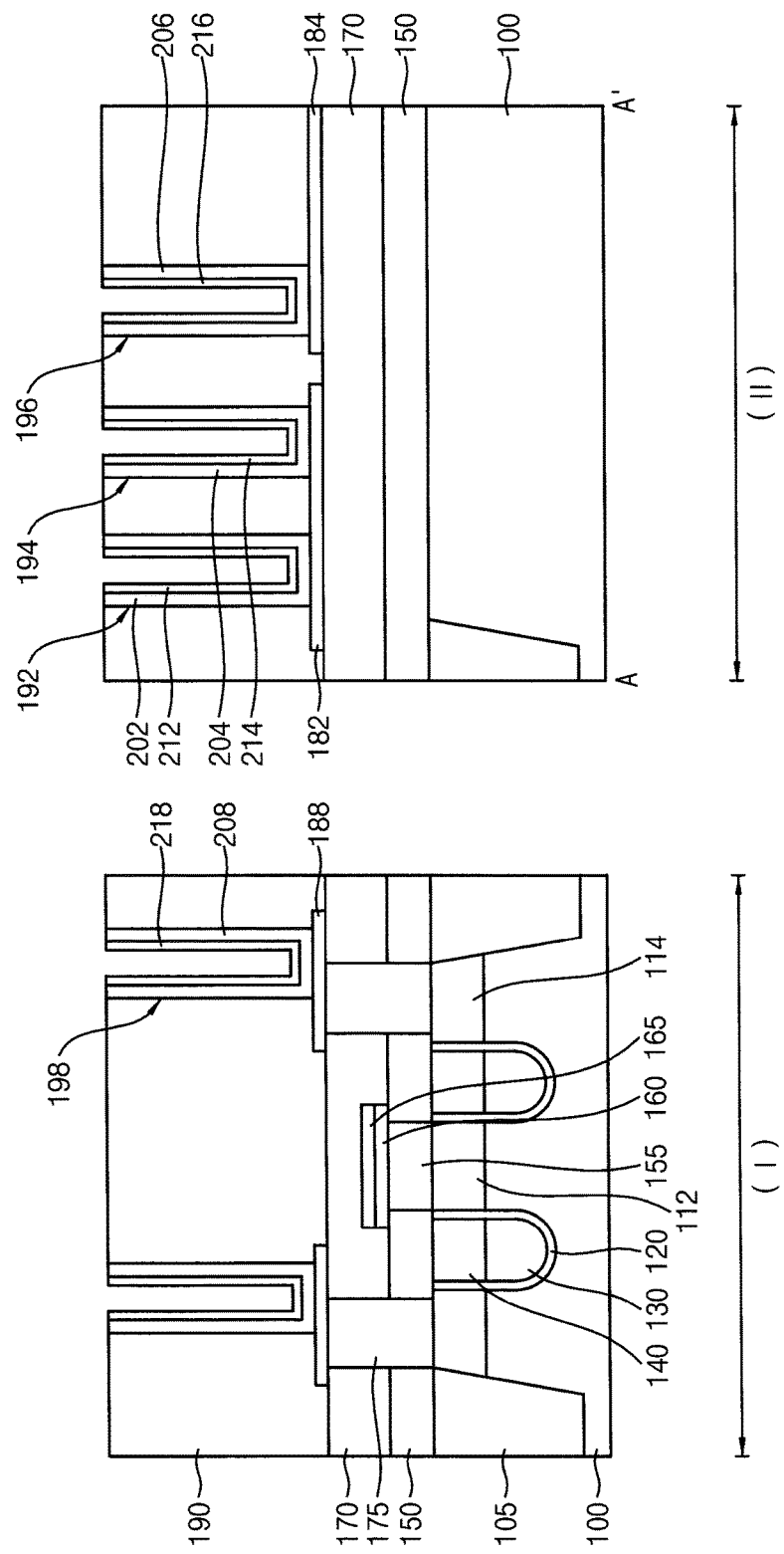

Referring to FIG. 9, lower electrodes 202, 204, 206 and 208 and dielectric layer patterns 212, 214, 216 and 218 may be formed on top surfaces of the landing pads 182, 184 and 186 and sidewalls of holes 192, 194, 196 and 198.

In exemplary embodiments, a lower electrode layer and a dielectric layer may be formed on the top surfaces of the landing pads 182, 184 and 186, along sides of the holes 192, 194, 196 and 198 and a top surface of the third insulating interlayer 190, and then top portions of the lower electrode layer and the dielectric layer may be removed by a CMP process or an etch back process, thereby forming the lower electrodes 202, 204, 206 and 208 and the dielectric layer patterns 212, 214, 216 and 218.

Accordingly, the fifth lower electrode 208 in the first region (I) may be formed simultaneously with the first to third lower electrodes 202, 204 and 206 in the second region (II). Furthermore, the fifth dielectric layer pattern 218 in the first region (I) may be formed simultaneously with the first to third dielectric layer patterns 212, 214 and 216.

Figure 10:
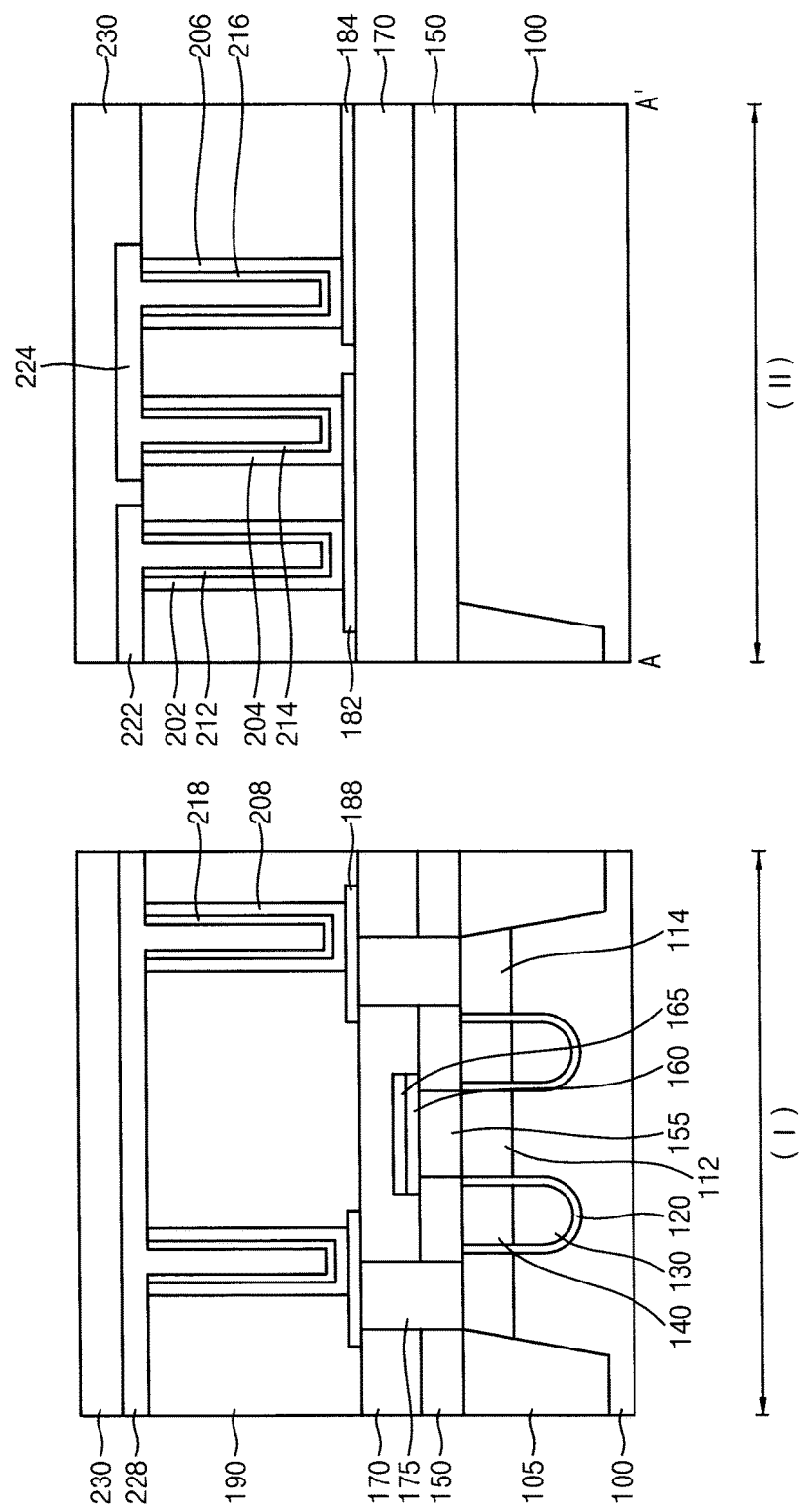

Referring to FIG. 10, upper electrodes 222, 224 and 228 may be formed on the third insulating interlayer 190 to fill the holes 192, 194, 196 and 198.

More specifically, an upper electrode layer may be formed on the third insulating interlayer 190 to fill the holes 192, 194, 196 and 198, and then the upper electrode layer may be partially removed to form the upper electrodes 222, 224 and 228.

Then, a fourth insulating interlayer 230 may be formed on the third insulating interlayer 190 to cover the upper electrodes 222, 224 and 228.

Figure 11:
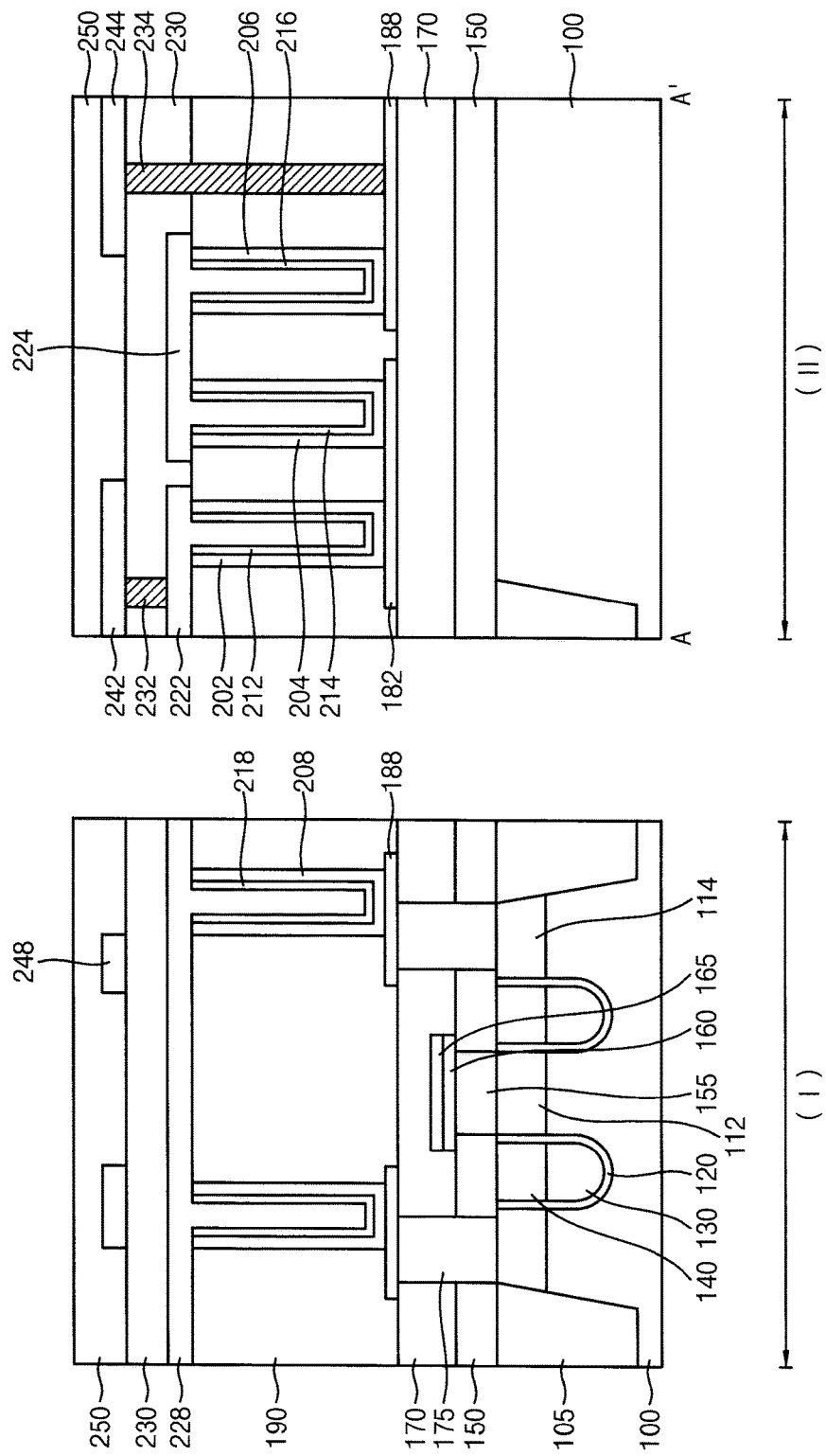

Referring to FIG. 11, after forming a third contact 232 and a fourth contact 234, wirings 242 and 244 may be formed on the fourth insulating interlayer 230.

In exemplary embodiments, the third contact 232 may be formed through the fourth insulating interlayer 230 and the fourth contact 234 may be formed through the third insulating interlayer 190 and the fourth insulating interlayer 230.

Then, a protection layer 250 may be formed to cover the wirings 242 and 244.

Figure 12:
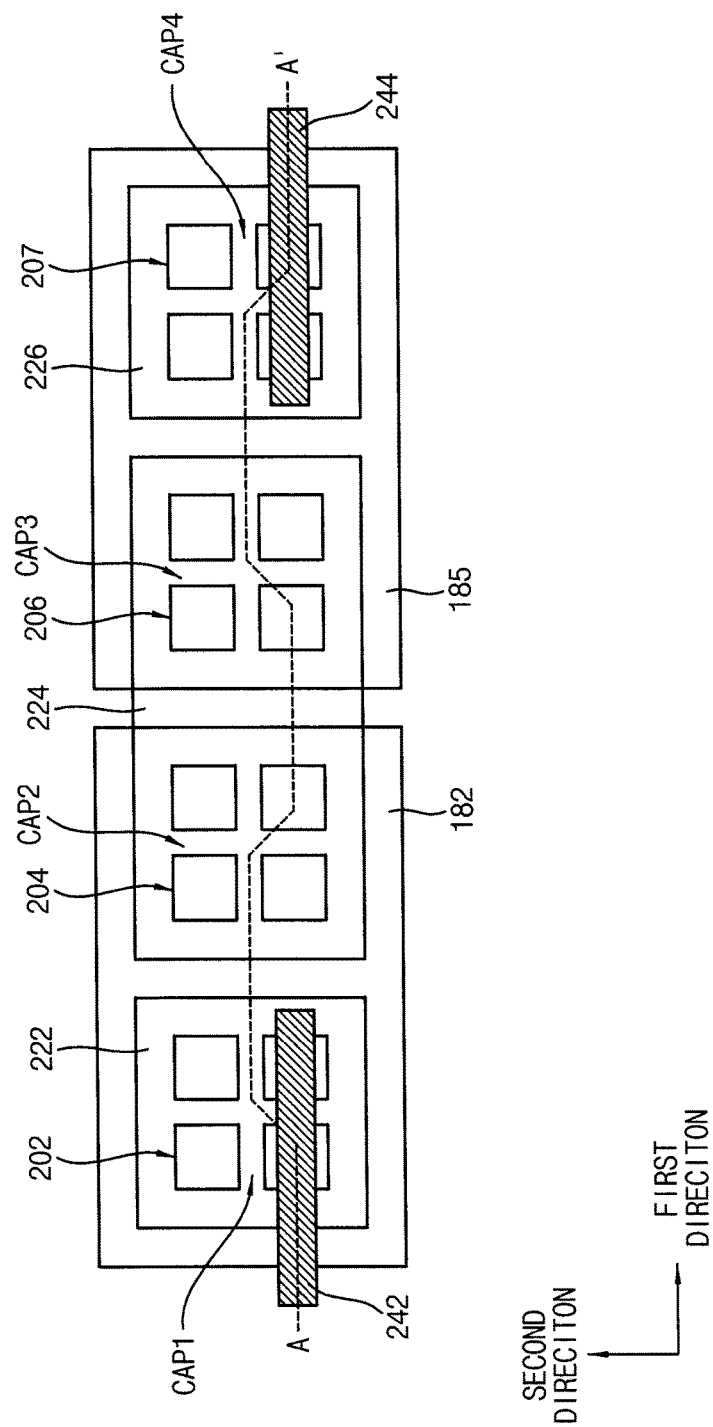
FIG. 12 is a plan view of a capacitor structure of a second embodiment of a semiconductor device in accordance with the inventive concept.
Figure 13:
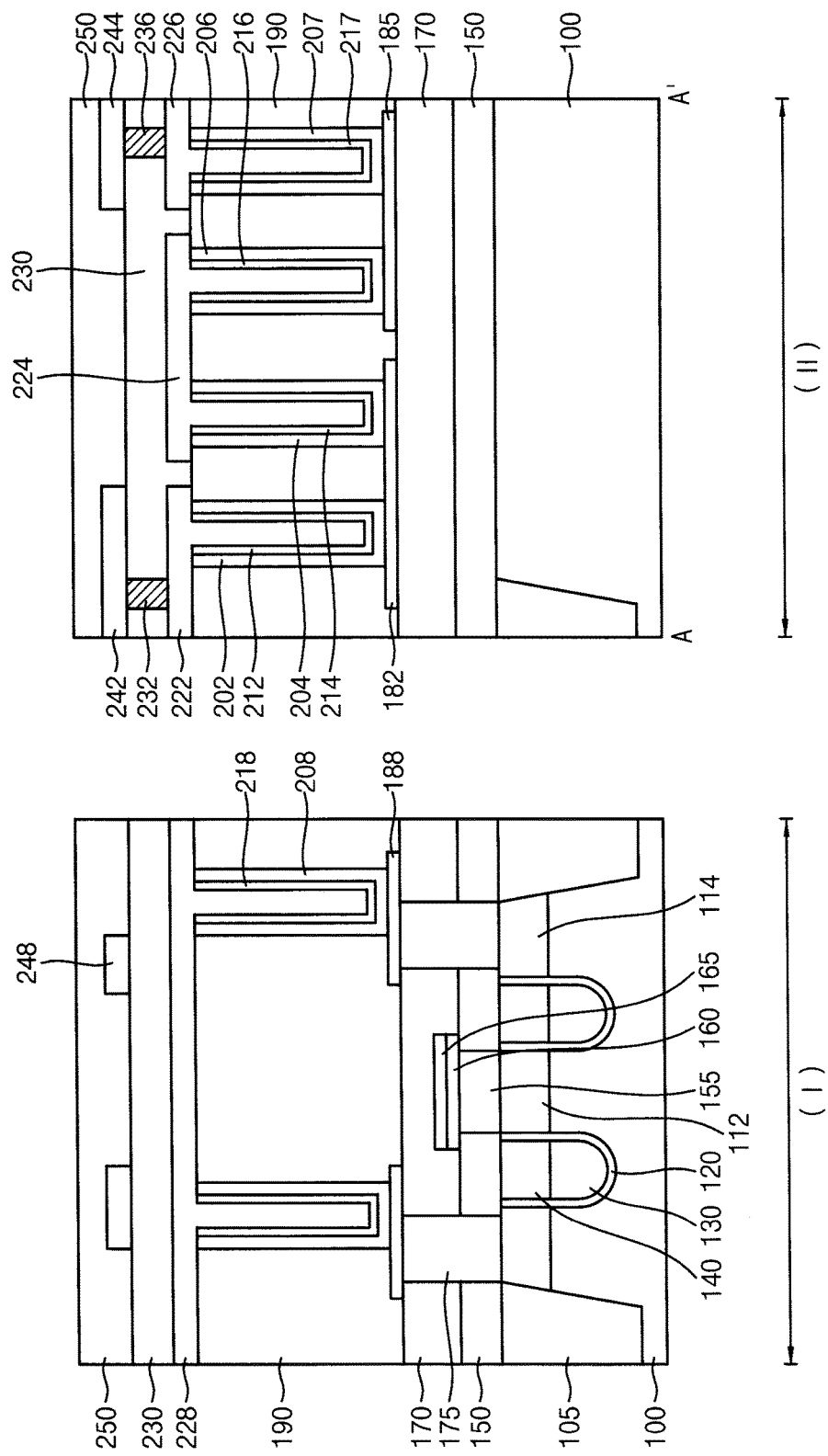
FIG. 13 illustrates the second embodiment of the semiconductor device and comprises a cross-sectional view taken along line A-A' of FIG. 12 and a cross-sectional view taken along a cell region of the semiconductor device.

FIG. 12 and FIG. 13 illustrate another embodiment of a semiconductor device according to the inventive concept.

Referring to FIGS. 12 and 13, the semiconductor device may comprise a memory structure disposed in a first region (I) of the device and a capacitor structure disposed in a second region (II) of the device. The memory structure may be substantially identical to that described with reference to FIG. 2. Therefore, the memory structure will not be described again in detail. The capacitor structure may be substantially similar to the capacitor structure described with reference to FIGS. 1-3 except for a second landing pad 185 and a fourth capacitor array.

A first landing pad 182 and a second landing pad 185 may be disposed on the second insulating interlayer 170 in the second region (II). The first landing pad 182 and the second landing pad 185 may extend in a first direction parallel to a top surface of the substrate 100. Furthermore, the first landing pad 182 and the second landing pad 185 may be spaced apart from each other in the first direction. Bottom surfaces of the first landing pad 182 and the second landing pad 185 may be insulated by the second insulating interlayer 170. That is, the first landing pad 182 and the second landing pad 185 may not be electrically connected to any other conductive pattern or material disposed below the first and second landing pads 182 and 185.

Lower electrodes 202, 204, 206 and 207 may be disposed on the first and second landing pads 182 and 185. In exemplary embodiments, a plurality of first lower electrodes 202 may be arranged in the first direction and the second direction substantially perpendicular to the first direction, thereby forming a first lower electrode array. A plurality of second lower electrodes 204 may be arranged in the first direction and the second direction, thereby forming a second lower electrode array, and a plurality of third lower electrodes 206 may be arranged in the first direction and the second direction, thereby forming a third lower electrode array. Furthermore, a plurality of fourth lower electrodes 207 may be arranged in the first direction and the second direction, thereby forming a fourth lower electrode array.

Each of the lower electrodes 202, 204, 206 and 207 may be associated with one of the landing pads 182 and 185. For example, the first lower electrodes 202 and the second lower electrodes 204 may be disposed directly on the first landing pad 182, and the third lower electrodes 206 and the fourth lower electrodes 207 may be disposed directly on the second landing pad 185. Accordingly, the first landing pad 182 may contact the first lower electrodes 202 and the second lower electrodes 204, and the second landing pad 185 may contact the third lower electrodes 206 and the fourth lower electrodes 207.

The dielectric layer patterns 212, 214, 216 and 217 may be disposed on the lower electrodes 202, 204, 206 and 207, respectively.

The upper electrodes 222, 224 and 226 may be disposed on the dielectric layer patterns 212, 214, 216 and 217, respectively. The first to third upper electrodes 222, 224 and 226 may be spaced apart from each other in the first direction. In exemplary embodiments, the first upper electrode 222 may overlap the first lower electrodes 202, the second upper electrodes 224 may overlap the second lower electrodes 204 and the third lower electrodes 206, and the third upper electrode 226 may overlap the fourth lower electrodes 207.

Therefore, the first lower electrodes 202, the first dielectric layer patterns 212 and the first upper electrode 222 may constitute a first capacitor array (CAP1), and the second lower electrodes 204, the second dielectric layer patterns 214 and the second upper electrode 224 may constitute a second capacitor array (CAP2). The third lower electrodes 206, the third dielectric layer patterns 216 and the second upper electrode 224 may constitute a third capacitor array (CAP3), and the fourth lower electrode 207, the fourth dielectric layer pattern 217 and the third upper electrode 226 may constitute a fourth capacitor array (CAP4).

In this case, the first capacitor array (CAP1) and the second capacitor array (CAP2) may be electrically connected in series by the first landing pad 182, and the second capacitor array (CAP2) and the third capacitor array (CAP3) may be electrically connected in series by the second upper electrode 224. Furthermore, the third capacitor array (CAP3) and the fourth capacitor array (CAP4) may be electrically connected in series by the second landing pad 185.

On the other hand, a first wiring 242 may be electrically connected to the first upper electrode 222 by a third contact 232, and a second wiring 244 may be electrically connected to the third upper electrode 226 by a fourth contact 236. Accordingly, the third contact 232 and the fourth contact 236 may have a minimal height, and an electrical resistance of each of the third contact 232 and the fourth contact 236 may be improved.

The capacitor arrays (CAP1, CAP2, CAP3, CAP4) may be directly connected to one another by the first landing pad 182, the second upper electrode 224 and the second landing pad 185 such that an electrical resistance between the capacitor arrays (CAP1, CAP2, CAP3, CAP4) may be minimized, and the capacitor structure may have an improved effective capacitance.

In the embodiment illustrated in FIGS. 12 and 13, the capacitor structure has only four capacitor arrays, i.e., the first to fourth capacitor arrays. However, the inventive concept is not limited thereto. For example, the capacitor structure may comprise any even number of capacitor arrays (e.g., 6, 8, 10 . . . ) adjacent ones of which are alternately and repeatedly connected by a landing pad and an upper electrode.

Figure 14:
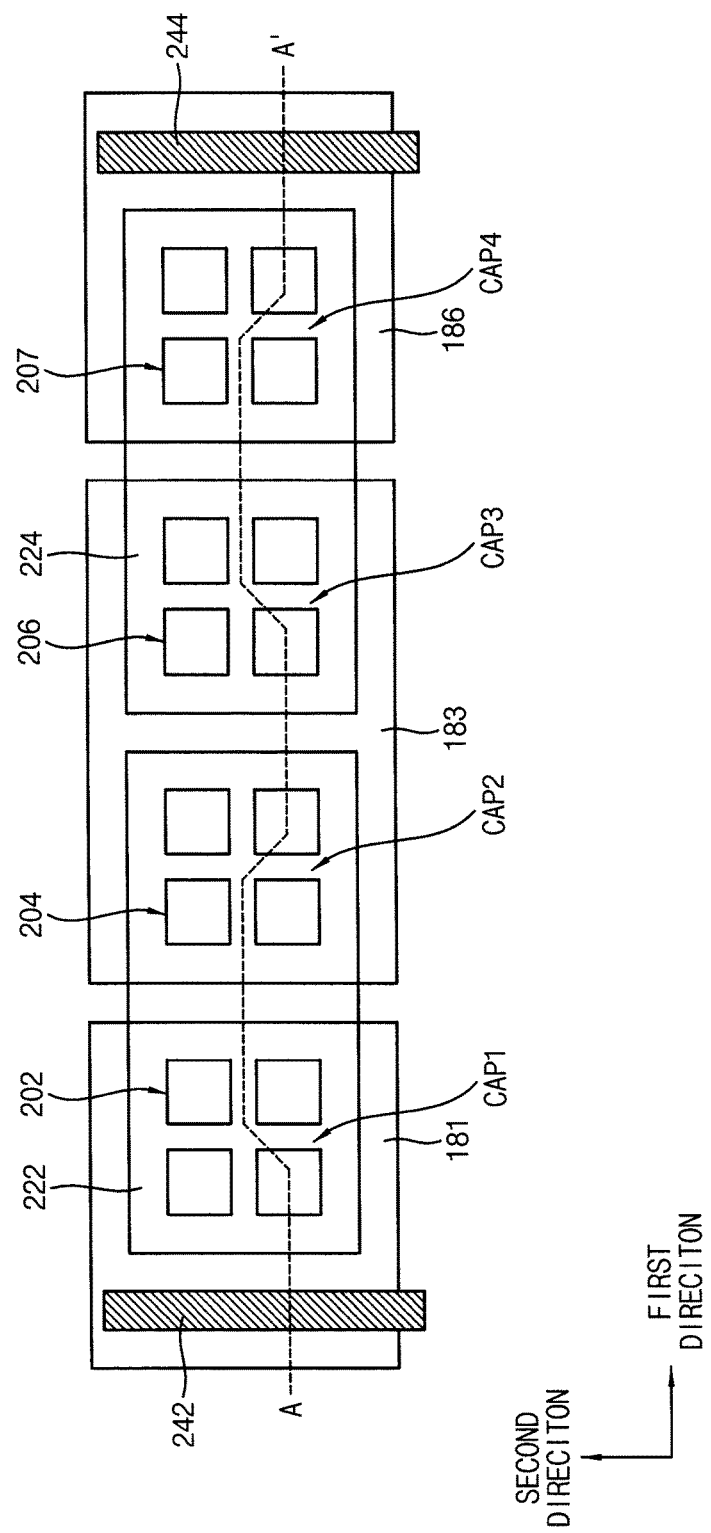
FIG. 14 is a plan view of a capacitor structure of a third embodiment of a semiconductor device in accordance with the inventive concept.
Figure 15:
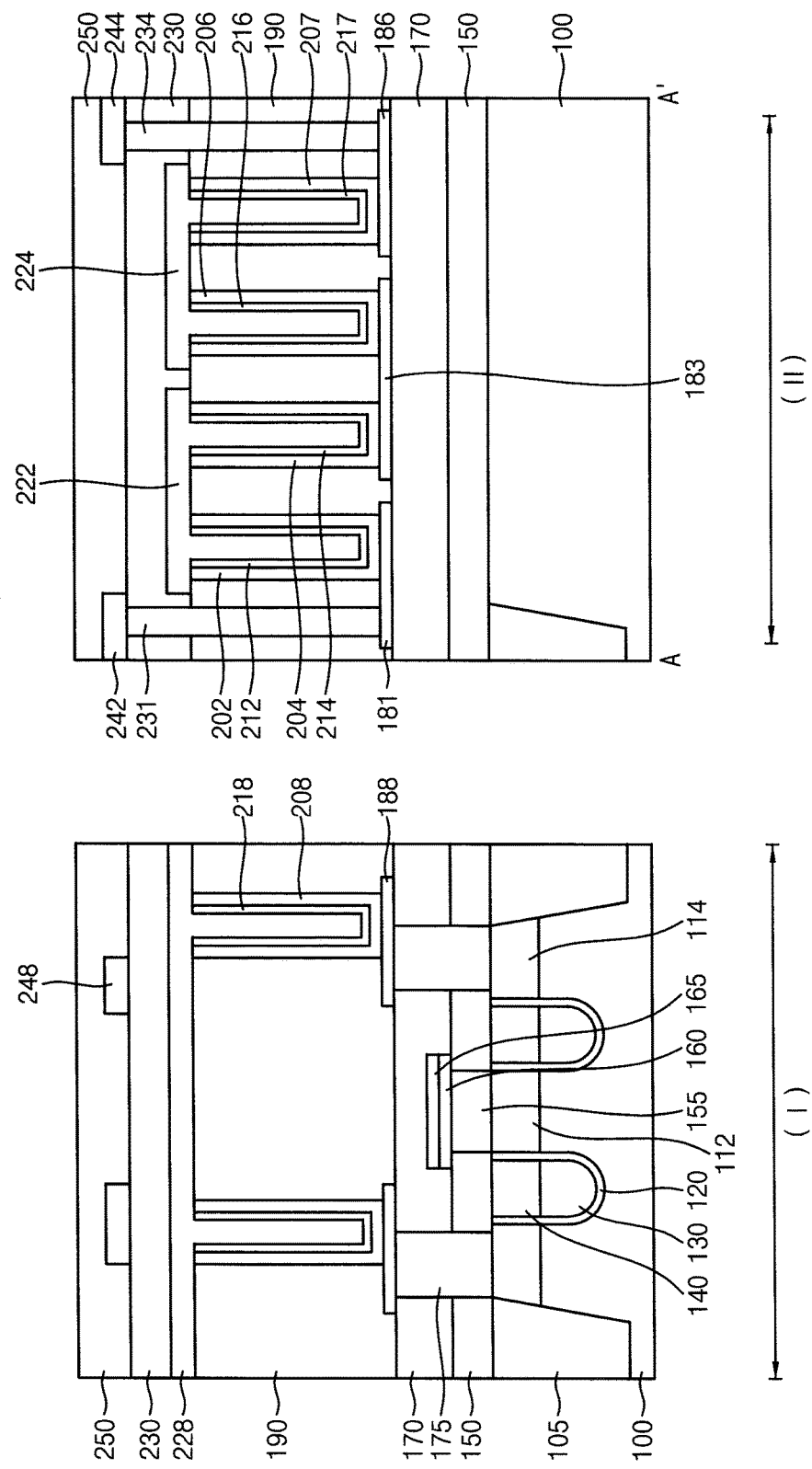
FIG. 15 illustrates the third embodiment of the semiconductor device and comprises a cross-sectional view taken along line A-A' of FIG. 14 and a cross-sectional view taken along a cell region of the semiconductor device.

Another embodiment of a semiconductor device in accordance with the inventive concept is illustrated in FIGS. 14 and 15.

Referring to FIGS. 14 and 15, the semiconductor device may comprise a memory structure disposed in a first region (I) of the device and a capacitor structure disposed in a second region (II) of the device. The memory structure may be substantially identical to that described with reference to FIG. 2. The capacitor structure may be substantially similar to the capacitor structure described with reference to FIGS. 1-3 except for landing pads 181, 183 and 186 and a fourth capacitor array.

A first landing pad 181, a second landing pad 183 and a fourth landing pad 186 may be disposed on the second insulating interlayer 170 in the second region (II) of the device. The first to third landing pads 181, 183 and 186 may be spaced apart from each other in a first direction parallel to a top surface of the substrate 100. Bottom surfaces of the first to third landing pads 181, 183 and 186 may be insulated by the second insulating interlayer 170. That is, the first to third landing pads 181, 183 and 186 may not be electrically connected to any other conductive pattern or material disposed below the first to third landing pads 181, 183 and 186.

Lower electrodes 202, 204, 206 and 207 may be disposed on the first to third landing pads 181, 183 and 186. In exemplary embodiments, a plurality of first lower electrodes 202 may be arranged in the first direction and the second direction substantially perpendicular to the first direction, thereby forming a first lower electrode array. A plurality of second lower electrodes 204 may be arranged in the first direction and the second direction, thereby forming a second lower electrode array, and a plurality of third lower electrodes 206 may be arranged in the first direction and the second direction, thereby forming a third lower electrode array. Furthermore, a plurality of fourth lower electrodes 207 may be arranged in the first direction and the second direction, thereby forming a fourth lower electrode array.

Each of the lower electrodes 202, 204, 206 and 207 may be associated with one of the first to third landing pads 181, 183 and 186. For example, the first lower electrodes 202 may be disposed directly on the first landing pad 181, and the second lower electrodes 204 and the third lower electrodes 206 may be disposed directly on the second landing pad 183. The fourth lower electrodes 207 may be disposed directly on the third landing pad 186. Accordingly, the second landing pad 183 may contact the second lower electrodes 204 and the third lower electrodes 206.

The dielectric layer patterns 212, 214, 216 and 217 may be disposed on the lower electrodes 202, 204, 206 and 207, respectively.

The upper electrodes 222 and 224 may be disposed on the dielectric layer patterns 212, 214, 216 and 217, respectively. The first and second upper electrodes 222 and 224 may extend in the first direction. Furthermore, the first and second upper electrodes 222 and 224 may be spaced apart from each other in the first direction. In exemplary embodiments, the first upper electrode 222 may overlap the first lower electrodes 202 and the second lower electrodes 204, and the second upper electrodes 224 may overlap the third lower electrodes 206 and the fourth lower electrodes 207.

Therefore, the first lower electrodes 202, the first dielectric layer patterns 212 and the first upper electrode 222 may constitute a first capacitor array (CAP1), and the second lower electrodes 204, the second dielectric layer patterns 214 and the first upper electrode 222 may constitute a second capacitor array (CAP2). The third lower electrodes 206, the third dielectric layer patterns 216 and the second upper electrode 224 may constitute a third capacitor array (CAP3), and the fourth lower electrode 207, the fourth dielectric layer pattern 217 and the second upper electrode 224 may constitute a fourth capacitor array (CAP4).

In this case, the first capacitor array (CAP1) and the second capacitor array (CAP2) may be electrically connected in series by the first upper electrode 222, and the second capacitor array (CAP2) and the third capacitor array (CAP3) may be electrically connected in series by the second landing pad 183. Furthermore, the third capacitor array (CAP3) and the fourth capacitor array (CAP4) may be electrically connected in series by the second upper electrode 224.

On the other hand, a first wiring 242 may be electrically connected to the first landing pad 183 by a third contact 231, and a second wiring 244 may be electrically connected to the third landing pad 186 by a fourth contact 234. Accordingly, even though the first and second wirings 242 and 244 do not overlap the first and second upper electrodes 222 and 224, the first and second wirings 242 and 244 may be electrically connected to the capacitor arrays.

The capacitor arrays (CAP1, CAP2, CAP3, CAP4) may be directly connected by the second landing pad 183, the first upper electrode 222 and the second upper electrode 224 such that an electrical resistance between the capacitor arrays (CAP1, CAP2, CAP3, CAP4) may be minimal, and the capacitor structure may have an improved effective capacitance.

In the embodiment illustrated in FIGS. 14 and 15, the capacitor structure may have only four capacitor arrays, i.e., may have the first to fourth capacitor arrays. However the inventive concept is not limited thereto. For example, the capacitor structure may comprise any even number of capacitor arrays (e.g., 6, 8, 10 . . . ), adjacent ones of which are alternately and repeatedly connected by a landing pad and an upper electrode.

Figure 17:
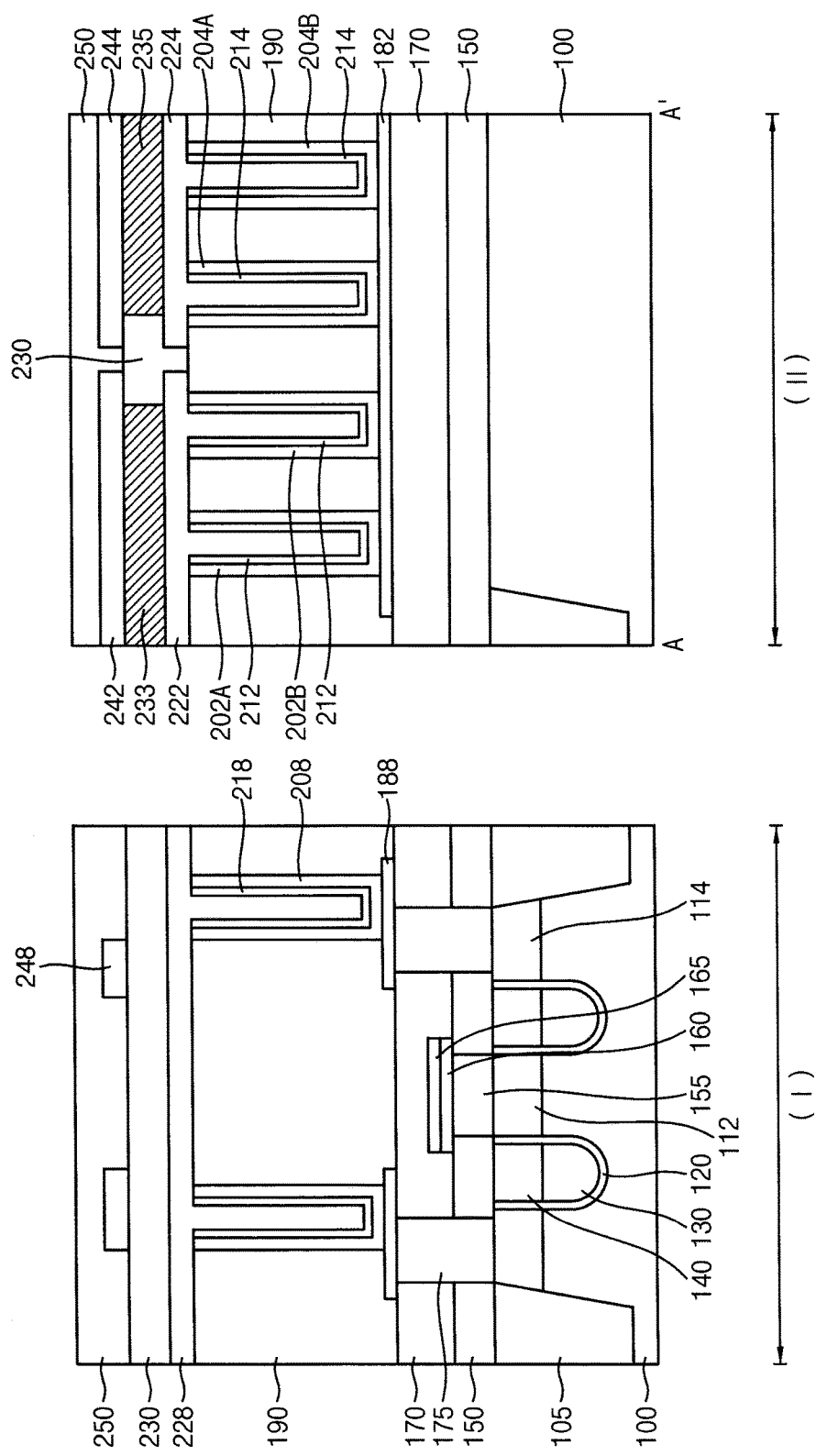
FIG. 17 illustrates the fourth embodiment of the semiconductor device and comprises a cross-sectional view taken along line A-A' of FIG. 16 and a cross-sectional view taken along a cell region of the semiconductor device.

Another embodiment of a semiconductor device in accordance with the inventive concept is illustrated in FIGS. 16 and 17.

Referring to FIGS. 16 and 17, the semiconductor device may comprise a memory structure disposed in a first region (I) of the device and a capacitor structure disposed in a second region (II) of the device. The memory structure may be substantially identical to that described with reference to FIG. 2.

A first landing pad 182 may be disposed on the second insulating interlayer 170 in the second region (II) of the device. The first landing pad 182 may extend in a first direction.

Lower electrodes 202A, 202B, 202C, 202D, 204A, 204B, 204C and 204D may be disposed directly on the first landing pad 182. Therefore, the first landing pad 182 may contact the lower electrodes 202A, 202B, 202C, 202D, 204A, 204B, 204C and 204D.

In exemplary embodiments, a plurality of first lower electrodes 202A, 202B, 202C and 202D may be arranged in the first direction and the second direction substantially perpendicular to the first direction, thereby forming a first lower electrode array. A plurality of second lower electrodes 204A, 204B, 204C and 204D may be arranged in the first direction and the second direction, thereby forming a second lower electrode array.

The dielectric layer patterns 212 and 214 may be disposed on the lower electrodes 202A, 202B, 202C, 202D, 204A, 204B, 204C and 204D, respectively.

The upper electrodes 222 and 224 may be disposed on the dielectric layer patterns 212 and 214, respectively. The first and second upper electrodes 222 and 224 may be spaced apart from each other in the first direction. In exemplary embodiments, the first upper electrode 222 may overlap the first lower electrodes 202A, 202B, 202C and 202D, and the second upper electrodes 224 may overlap the second lower electrodes 204A, 204B, 204C and 204D.

Therefore, the first lower electrodes 202A, 202B, 202C and 202D, the first dielectric layer patterns 212 and the first upper electrode 222 may constitute a first capacitor array (CAP1), and the second lower electrodes 204A, 204B, 204C and 204D, the second dielectric layer patterns 214 and the second upper electrode 224 may constitute a second capacitor array (CAP2).

In this case, the first capacitor array (CAP1) and the second capacitor array (CAP2) may be electrically connected in series by the first landing pad 182.

On the other hand, a first wiring 242 may be electrically connected to the first upper electrode 222 by a third contact 233, and a second wiring 244 may be electrically connected to the second upper electrode 224 by a fourth contact 235. In exemplary embodiments, the first wiring 242 and the second wiring 244 may extend in the first direction. Furthermore, the first wiring 242 and the second wiring 244 may be spaced apart from each other in the first direction. Furthermore, the third contact 233 and the fourth contact 235 may have a bar shape and extend longitudinally, i.e., may be elongated, in the first direction, when viewed in a direction substantially perpendicular to the top surface of the substrate 100. Accordingly, the first wiring 242, the second wiring 244, the third contact 233 and the fourth contact 235 may extend in the same direction, and the first capacitor array and the second capacitor array are spaced apart from each other in the same direction. Therefore, the capacitor structure may have an improved effective capacitance. This will be described with respect to a comparative example illustrated in FIG. 18.

Figure 18:
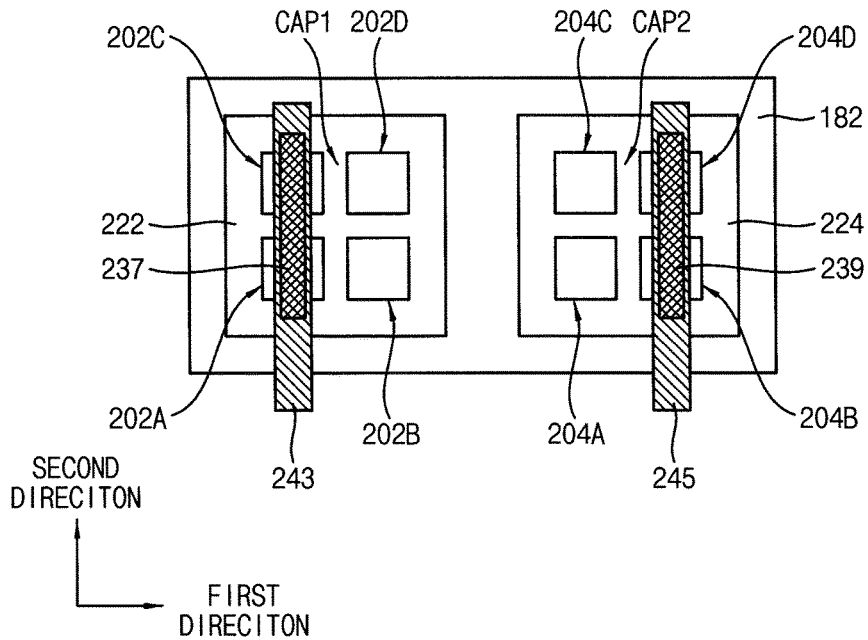
FIG. 18 is a plan view of an example of a semiconductor device for use in comparison with the fourth embodiment.

The capacitor structure of the semiconductor device of the comparative example of FIG. 18 is substantially similar to the capacitor structure described with reference to FIGS. 16 and 17 except for the contacts 237 and 239 and the wirings 243 and 245.

A first capacitor array and a second capacitor array are spaced apart from each other in a first direction.

A first wiring 243 and a second wiring 245 extend in a second direction substantially perpendicular to the first direction. Furthermore, the first wiring 243 is electrically connected to the first upper electrode 222 by a third contact 237, and a second wiring 245 is electrically connected to the second upper electrode 224 by a fourth contact 239. Each of the third contact 237 and the fourth contact 239 have a bar shape and extend longitudinally in the second direction.

Accordingly, the first wiring 243, the second wiring 245, the third contact 237 and the fourth contact 239 extend in the same direction, while the first capacitor array and the second capacitor array are spaced apart from each other in another direction.

Table 1 shows a simulation result of effective capacitance and effective resistance in accordance with an exemplary embodiment (FIGS. 16 and 17) and the comparative example (FIG. 18). According to the simulation result, the capacitor structure of the exemplary embodiment has a lower effective resistance compared to the example of FIG. 18. Accordingly, it is shown that the direction of the wirings and the contacts in the embodiment of FIGS. 16 and 17 optimize the resistance characteristics of the capacitor structure.

|  | Drawing | Effective capacitance (pF) | Effective resistance (Ω) | Improvement in effective resistance |
|---|---|---|---|---|
| Exemplary embodiment | FIGS. 16 and 17 | 10.8 | 20.3 | −42.1% |
| Comparative embodiment | FIG. 18 | 10.8 | 35.1 | — |

Figure 19:
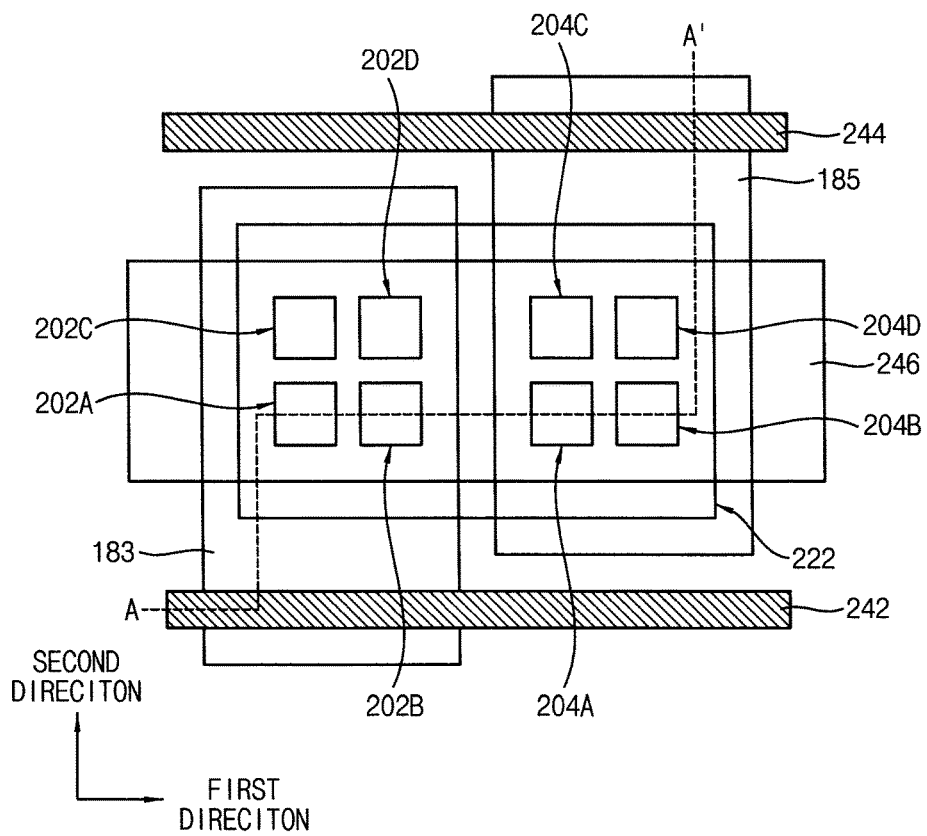
FIG. 19 is a plan view of a capacitor structure of a fifth embodiment of a semiconductor device in accordance with the inventive concept.
Figure 20:
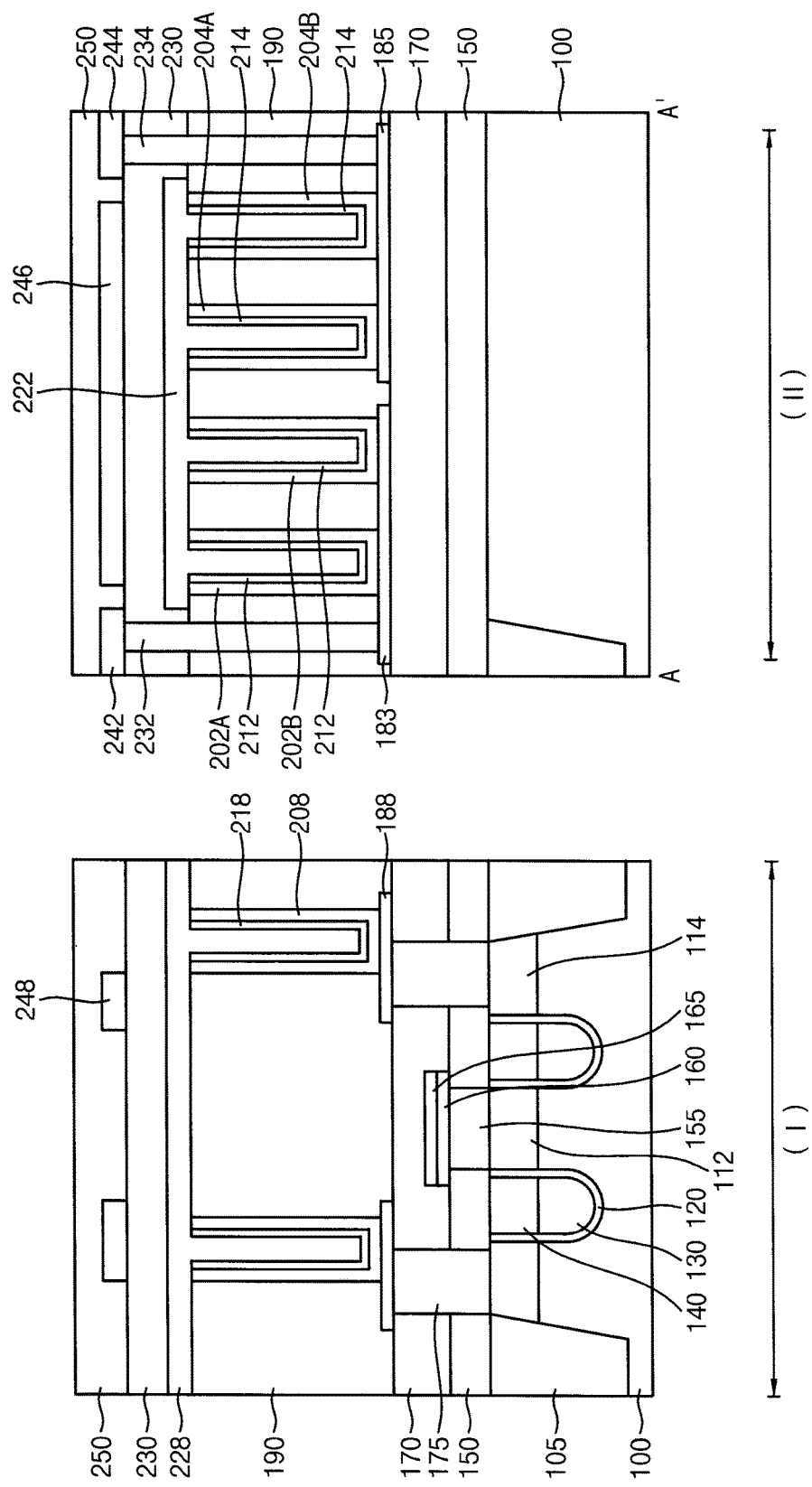
FIG. 20 illustrates the fifth embodiment of the semiconductor device and comprises a cross-sectional view taken along line A-A' of FIG. 19 and a cross-sectional view taken along a cell region of the semiconductor device.

Another embodiment of a semiconductor device in accordance with the inventive concept is shown in FIGS. 19 and 20.

Referring to FIGS. 19 and 20, the semiconductor device may comprise a memory structure disposed in a first region (I) of the device and a capacitor structure disposed in a second region (II) of the device. The memory structure may be substantially identical to that described with reference to FIG. 2.

A first landing pad 183 and a second landing pad 185 may be disposed on the second insulating interlayer 170 in the second region (II) of the device. The first and second landing pads 183 and 185 may be spaced apart from each other in a first direction parallel to a top surface of the substrate 100. Furthermore, each of the first and second landing pads 183 and 185 may extend in a second direction which may be substantially perpendicular to the first direction.

Lower electrodes 202A, 202B, 202C, 202D, 204A, 204B, 204C and 204D may be disposed on the first and second landing pad 183 and 185. In exemplary embodiments, the first lower electrodes 202A, 202B, 202C and 202D may be disposed on the first landing pad 183, and the second lower electrode 204A, 204B, 204C and 204D may be disposed on the second landing pad 185.

In exemplary embodiments, a plurality of first lower electrodes 202A, 202B, 202C and 202D may be arranged in the first direction and the second direction substantially perpendicular to the first direction, thereby forming a first lower electrode array. A plurality of second lower electrodes 204A, 204B, 204C and 204D may be arranged in the first direction and the second direction, thereby forming a second lower electrode array.

The dielectric layer patterns 212 and 214 may be disposed on the lower electrodes 202A, 202B, 202C, 202D, 204A, 204B, 204C and 204D, respectively.

The upper electrode 222 may be disposed on the dielectric layer patterns 212 and 214. The upper electrode 222 may overlap the first lower electrodes 202A, 202B, 202C and 202D and the second lower electrodes 204A, 204B, 204C and 204D.

Therefore, the first lower electrodes 202A, 202B, 202C and 202D, the first dielectric layer patterns 212 and the upper electrode 222 may constitute a first capacitor array (CAP1), and the second lower electrodes 204A, 204B, 204C and 204D, the second dielectric layer patterns 214 and the upper electrode 222 may constitute a second capacitor array (CAP2).

In this case, the first capacitor array (CAP1) and the second capacitor array (CAP2) may be electrically connected in series by the upper electrode 222.

Referring now to FIG. 20, a first wiring 242, a second wiring 244 and a third wiring 246 may be disposed on a fourth insulating interlayer 230.

In exemplary embodiments, the third wiring 246 may overlap the first upper electrode 222. The third wiring 246 may not be electrically connected to the capacitor structure. That is, the third wiring 246 may serve merely to transfer an electrical signal through the second region (II) of the device. However, due to its disposition the third wiring 246 makes it difficult to electrically connect the first wiring 242 and the second wiring 244 to the first upper electrode 222.

Nonetheless, first wiring 242 may be electrically connected to the first landing pad 183 by a third contact 232, and second wiring 244 may be electrically connected to the second landing pad 185 by a fourth contact 234. Accordingly, even though the first wiring 242 and the second wiring 244 do not overlap the upper electrode 222, the first and second wirings 242 and 244 may be electrically connected to the capacitor arrays.

Figure 21:
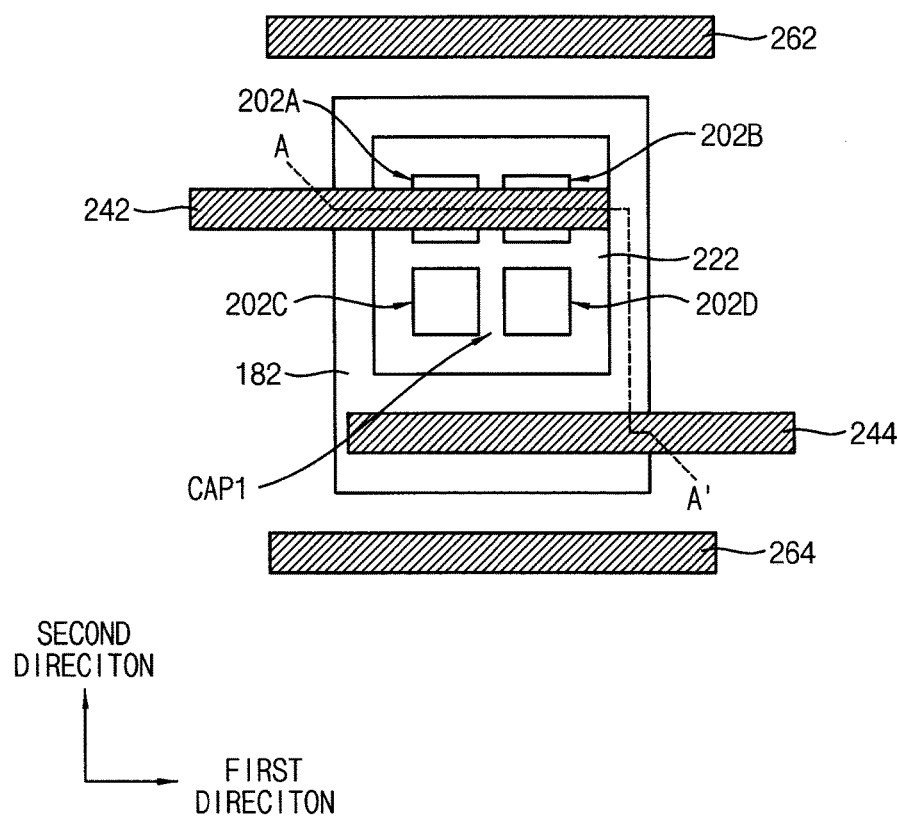
FIG. 21 is a plan view of a capacitor structure of a sixth embodiment of a semiconductor device in accordance with the inventive concept.
Figure 22:
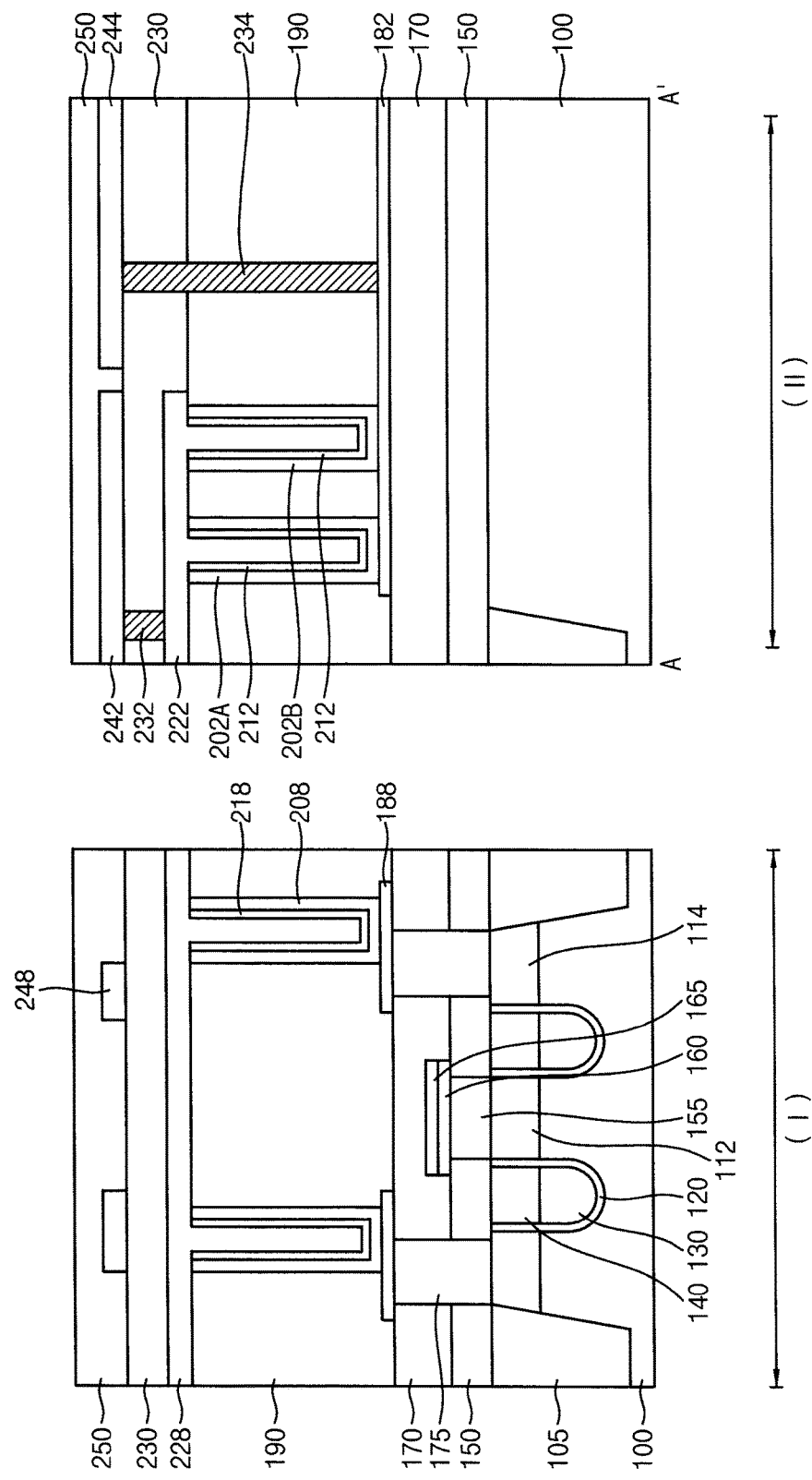
FIG. 22 illustrates the sixth embodiment of the semiconductor device and comprises a cross-sectional view taken along line A-A' of FIG. 21 and a cross-sectional view taken along a cell region of the semiconductor device.

Another embodiment of a semiconductor device in accordance with the inventive concept is shown in FIGS. 21 and 22.

Referring to FIGS. 21 and 22, the semiconductor device may comprise a memory structure disposed in a first region (I) of the device and a capacitor structure disposed in a second region (II) of the device. The memory structure may be substantially identical to that described with reference to FIG. 2.

A first landing pad 182 may be disposed on the second insulating interlayer 170 in the second region (II) of the device. The first landing pad 182 may have the shape of a plate.

Lower electrodes 202A, 202B, 202C and 202D may be disposed on the first landing pad 182. In exemplary embodiments, a plurality of first lower electrodes 202A, 202B, 202C and 202D may be arranged in the first direction and the second direction substantially perpendicular to the first direction, thereby forming a first lower electrode array.

The dielectric layer patterns 212 may be disposed on the lower electrodes 202A, 202B, 202C and 202D, respectively. The upper electrode 222 may be disposed on the dielectric layer patterns 212.

Therefore, the first lower electrodes 202A, 202B, 202C and 202D, the first dielectric layer patterns 212 and the upper electrode 222 may constitute a first capacitor array (CAP1). In this case, the first capacitors of the first capacitor array (CAP1) may be electrically connected in parallel.

Referring now to FIG. 22, a first wiring 242 and a second wiring 244 may be disposed on a fourth insulating interlayer 230. In this embodiment, the first wiring 242 and the second wiring 244 may extend in a first direction.

The first wiring 242 may be electrically connected to the upper electrode 222 by a third contact 232, and the second wiring 244 may be electrically connected to the first landing pad 182 by a fourth contact 234. Accordingly, the first wiring 242 and the second wiring 244 may be electrically connected to the first capacitor array (CAP1). Furthermore, the capacitor array may have a single stage structure.

Referring now to FIG. 21, lower metal patterns 262 and 264 may be disposed on the fourth insulating interlayer 230. The lower metal patterns 262 and 264 may not form a closed loop, when viewed in a direction substantially perpendicular to a top surface of the substrate 100. For example, the lower metal patterns 262 and 264 may each have a bar shape extending in the first direction or a second direction.

Each of the lower metal patterns 262 and 264 may serve as a terminal for connecting the semiconductor device with external wirings of a semiconductor package.

In exemplary embodiments, the lower metal patterns 262 and 264 may not form the closed loop, so that the first and second wirings 242 and 244 may not overlap the lower metal patterns 262 and 264.

Figure 23:
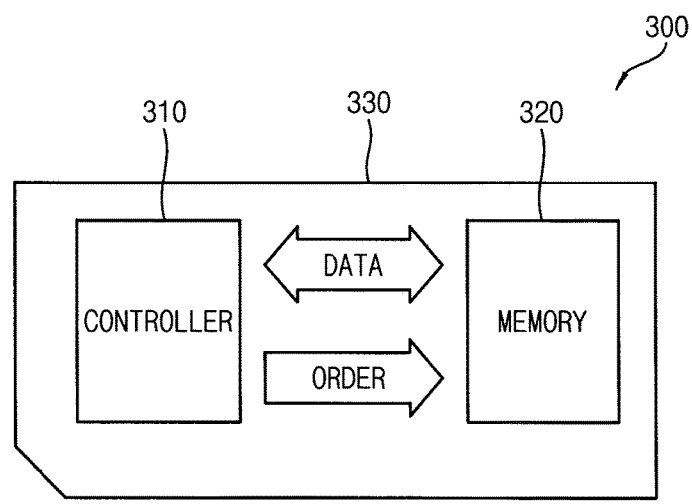
FIG. 23 is a schematic diagram of a memory system in accordance with the inventive concept.

FIG. 23 illustrates an embodiment of a memory system in accordance with the inventive concept.

Referring to FIG. 23, a controller 310 and a memory 320 may be configured to exchange electric signals. For example, the memory 320 and the controller 310 may transfer data with each other according to a command of the controller 310. Accordingly, the memory system 300 may store data in the memory 320 or output data from the memory 320.

The memory 320 may comprise one of the semiconductor devices described with reference to FIGS. 1-22. The memory 320 may be a dynamic random access memory (DRAM), a static random access memory (SRAM), a flash memory, a phase change RAM (PRAM), a non-volatile memory or the like.

The memory system 300 may be employed by mobile or portable electronic devices or products, such as a multi media card (MMC) or a secure digital (SD) card.

Figure 24:
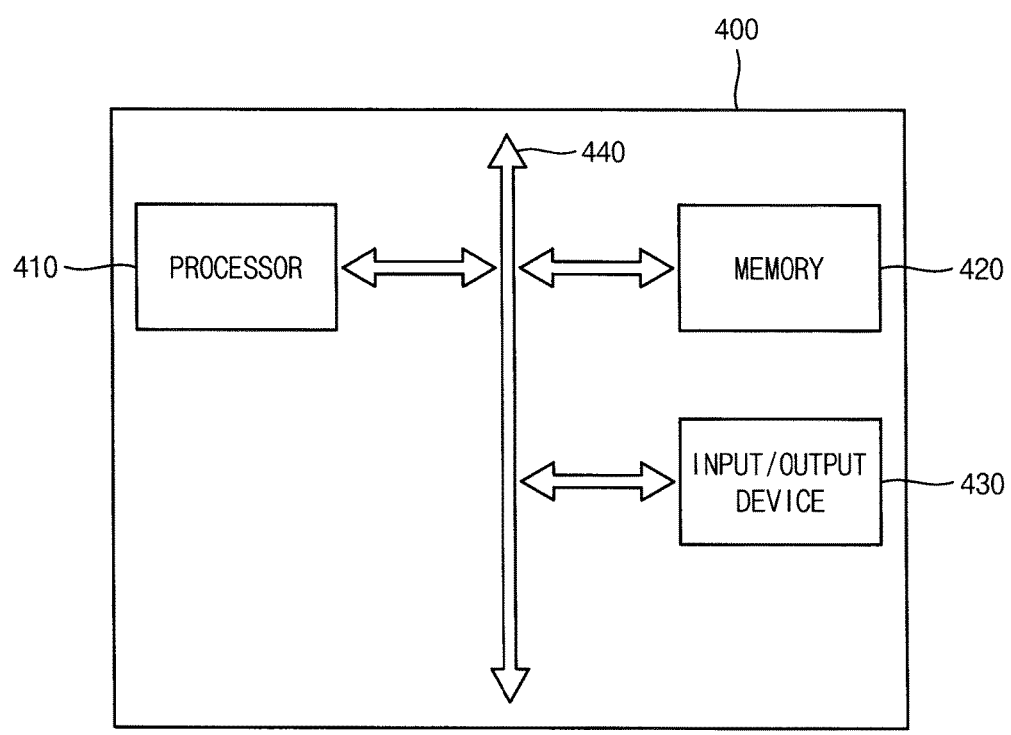
FIG. 24 is a schematic diagram of an electronic system in accordance with the inventive concept.

FIG. 24 illustrates an embodiment of an electronic system in accordance with the inventive concept.

Referring to FIG. 24, a processor 410, an input/output device 430, and a memory 420 may communicate with each other through a bus 440. The processor 410 may execute a program and control the system 400. The input/output device 430 may input or output data of the system 400. The system 400 may be connected to an external device, such as a personal computer or a network, via the input/output device 430 so as to exchange data with the external device.

The memory 420 may store a code or data for operation of the processor 410. The memory 420 may comprise anyone of the semiconductor devices described with reference to FIGS. 1-22. The memory 420 may comprise a DRAM, an SRAM, a flash memory, a PRAM, or the like.

The system 400 may be employed by mobile or portable electronic devices or products, such as mobile phones, MP3 players, navigation systems, solid state drives (SSDs), and household appliances.

As described above, a semiconductor device may comprise a plurality of capacitor arrays, and these capacitor arrays may be electrically connected by a landing pad and/or an upper electrode. Therefore, electrical resistance between the capacitor arrays may be minimized, and the capacitor structure may have an improved effective capacitance.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device, comprising:
    a substrate spanning a first region and a second region of the device;
    a memory structure disposed in the first region; and
    a capacitor structure disposed in the second region,
    wherein the capacitor structure comprises:
        a first capacitor array of a plurality of first capacitors each having a lower electrode, a dielectric layer pattern and an upper electrode;

a second capacitor array of a plurality of second capacitors each having a lower electrode, a dielectric layer pattern and an upper electrode;

a third capacitor array of a plurality of third capacitors each having a lower electrode, a dielectric layer pattern and an upper electrode; and a first landing pad interposed between the substrate and the lower electrodes of the first and second capacitors, contacting the lower electrodes of each of the first and second capacitors, and electrically connecting the first capacitors and the second capacitors to one another, and wherein the upper electrodes of the second and third capacitors are integral such that the second capacitors and the third capacitors are electrically connected to each other.

2. The semiconductor device of claim 1, further comprising a first insulating interlayer interposed between the substrate and the first landing pad, wherein an upper surface of the first insulating interlayer is uninterrupted beneath the entirety of the first landing pad such that the first insulating interlayer electrically isolates the first landing pad from any conductive element or material disposed under the first landing pad.

3. The semiconductor device of claim 1, further comprising a second landing pad interposed between the substrate and the lower electrodes of the third capacitors, wherein the second landing pad contacts the lower electrode of each of the third capacitors.

4. The semiconductor device of claim 3, further comprising:

a second insulating interlayer covering the first upper electrode, the second upper electrode and the third upper electrode;

first wiring disposed on the second insulating interlayer;

second wiring disposed on the second insulating interlayer, the second wiring being spaced apart from the first wiring;

a first contact extending through the second insulating interlayer, the first contact contacting the upper electrode of one of the first capacitors and the first wiring; and a second contact extending through the second insulating interlayer, the second contact contacting the second landing pad and the second wiring.

5. The semiconductor device of claim 4, wherein the first capacitor array, the second capacitor array and the third capacitor array are spaced apart from each other in a first direction parallel to a top surface of the substrate, and wherein the first wiring and the second wiring comprise linear segments of wire each extending longitudinally in the first direction.

6. The semiconductor device of claim 3, further comprising a fourth capacitor array of a plurality of fourth capacitors each having a lower electrode, a dielectric layer pattern and an upper electrode, wherein the second and third capacitor arrays are interposed between the first and fourth capacitor arrays, and wherein the second landing pad is interposed between the substrate and the lower electrodes of the third and fourth capacitors, contacts the lower electrodes of the third and fourth capacitors, and electrically connects the third capacitors and the fourth capacitors to one another.

7. The semiconductor device of claim 6, further comprising:

a second insulating interlayer covering the first upper electrode, the second upper electrode, the third upper electrode and the fourth upper electrode;

a first wiring disposed on the second insulating interlayer;

a second wiring disposed on the second insulating interlayer, the second wiring being spaced apart from the first wiring;

a first contact extending through the second insulating interlayer, the first contact contacting the upper electrode of one of the first capacitors and the first wiring; and a second contact extending through the second insulating interlayer, the second contact contacting the upper electrode of one of said fourth capacitors and the second wiring.

8. The semiconductor device of claim 3, further comprising a fourth capacitor array of a plurality of fourth capacitors each having a lower electrode, a dielectric layer pattern and an upper electrode, wherein the first and second capacitor arrays are interposed between the third and fourth capacitor arrays, and wherein the upper electrodes of the fourth capacitors and the upper electrodes of the first capacitors are integral such that the capacitors of the fourth capacitor array are electrically connected to the capacitors of the first capacitor array.

9. The semiconductor device of claim 8, further comprising:

a third landing pad interposed between the substrate and the lower electrodes of the fourth capacitors, the third landing pad contacting the lower electrodes of each of the fourth capacitors;

a second insulating interlayer covering the upper electrodes of the capacitors of the first, second, third and fourth capacitor arrays;

a first wiring disposed on the second insulating interlayer;

a second wiring disposed on the second insulating interlayer, the second wiring being spaced apart from the first wiring;

a first contact extending through the second insulating interlayer, the first contact contacting the second landing pad and the first wiring; and a second contact extending through the second insulating interlayer, the second contact contacting the third landing pad and the second wiring.

10. The semiconductor device of claim 1, wherein the memory structure comprises:

a transistor;

a landing pad electrically connected to the transistor; and a capacitor disposed on the landing pad of the memory structure, the capacitor of the memory structure including a lower electrode, a dielectric layer pattern and an upper electrode.

11. The semiconductor device of claim 10, wherein the landing pad of the memory structure and the first landing pad are disposed at the same level in the device and comprise the same material.

12. The semiconductor device of claim 1, wherein the first capacitors are arrayed in a first direction parallel to a top surface of the substrate and a second direction perpendicular to the first direction, wherein the second capacitors are arrayed in the first direction and the second direction, and wherein the third capacitors are arrayed in the first direction and the second direction.

13. A semiconductor device, comprising:
a substrate spanning a first region and a second region of the device;
a first interlayer insulating layer disposed on the substrate and spanning the first and second regions of the device;
a memory structure, including at least one memory element, disposed in the first region; and
a capacitor structure disposed in the second region, and wherein the capacitor structure comprises:
an array of capacitors each extending vertically in the first interlayer insulating layer in the second region, the capacitors having respective discrete lower electrodes arranged in a two-dimensional horizontal array, a common upper electrode, and discrete dielectric layer patterns each interposed between a respective one of the lower electrodes and the common upper electrode,
a pad in the form of a plate of electrically conductive material interposed between the substrate and the lower electrodes of the capacitors of the array, and contacting the lower electrodes of the capacitors,
a second interlayer insulating layer disposed on the first interlayer insulating layer,
first and second wirings on the second interlayer insulating layer, and
first and second contacts extending from the first and second wirings, respectively, into the second interlayer insulating layer, and
wherein the common upper electrode of the capacitors comprises vertical columns of electrically conductive material each extending upright in the first interlayer insulating layer and surrounded by a respective one of the dielectric layer patterns, and a layer of conductive material extending on the first interlayer insulating layer and connecting the vertical columns of electrically conductive material to one another, the vertical columns being arranged in a horizontal two-dimensional array in correspondence with the lower electrodes,
the first contact is electrically connected to the capacitor array at the common upper electrode, and
the second contact is electrically connected to the capacitor array at the lower electrodes via the pad of electrically conductive material.

14. The semiconductor device of claim 13, wherein the array of capacitors constitutes a first capacitor array, the pad of electrically conductive material constitutes a first pad, and the capacitor structure further comprises:
second and third capacitor arrays,
the second capacitor array including second capacitors each extending vertically in the first interlayer insulating layer in the second region,
the second capacitors having respective discrete lower electrodes arranged in a two-dimensional horizontal array, a common upper electrode, and discrete dielectric layer patterns each interposed between a respective one of the lower electrodes of the second capacitors and the common upper electrode of the second capacitors,
the third capacitor array including third capacitors each extending vertically in the first interlayer insulating layer in the second region,
the third capacitors having respective discrete lower electrodes arranged in a two-dimensional horizontal array, a common upper electrode, and discrete dielectric layer patterns each interposed between a respective one of the lower electrodes of the third capacitors and the common upper electrode of the third capacitors, and
a second pad in the form of a plate of electrically conductive material interposed between the substrate and the lower electrodes of the third capacitors, contacting the lower electrodes of the third capacitors, and spaced from the first pad, and
wherein the first pad is also interposed between the substrate and the lower electrodes of the second capacitors, and contacts the lower electrodes of the second capacitors,
the common upper electrode of the second capacitors comprises second vertical columns of electrically conductive material each extending upright in the first interlayer insulating layer and surrounded by a respective one of the dielectric layer patterns, and a layer of conductive material extending on the first interlayer insulating layer and connecting the second vertical columns of electrically conductive material to one another, the second vertical columns being arranged in a horizontal two-dimensional array in correspondence with the lower electrodes of the second capacitors,
the common upper electrode of the third capacitors comprises third vertical columns of electrically conductive material each extending upright in the first interlayer insulating layer and surrounded by a respective one of the dielectric layer patterns, and a layer of conductive material extending on the first interlayer insulating layer and connecting the third vertical columns of electrically conductive material to one another, the third vertical columns being arranged in a horizontal two-dimensional array in correspondence with the lower electrodes of the third capacitors,
the layer of conductive material of the common upper electrode of the second capacitors is contiguous with the layer of conductive material of the common upper electrode of the third capacitors, and
the first contact extends vertically in the second interlayer insulating layer between the first wiring and the layer of conductive material of the common upper electrode of the first capacitors, and
the second contact extends vertically in the first and second interlayer insulating layers between the second wiring and the second pad.

15. The semiconductor device of claim 13, wherein the array of capacitors constitutes a first capacitor array, the pad of electrically conductive material constitutes a first pad, and the capacitor structure further comprises:
second, third and fourth capacitor arrays,
the second capacitor array including second capacitors each extending vertically in the first interlayer insulating layer in the second region,
the second capacitors having respective discrete lower electrodes arranged in a two-dimensional horizontal array, a common upper electrode, and discrete dielectric layer patterns each interposed between a respective one of the lower electrodes of the second capacitors and the common upper electrode of the second capacitors,
the third capacitor array including third capacitors each extending vertically in the first interlayer insulating layer in the second region,
the third capacitors having respective discrete lower electrodes arranged in a two-dimensional horizontal array, a common upper electrode, and discrete dielectric layer patterns each interposed between a respective one of the lower electrodes of the third capacitors and the common upper electrode of the third capacitors, the fourth capacitor array including fourth capacitors each extending vertically in the first interlayer insulating layer in the second region, the fourth capacitors having respective discrete lower electrodes arranged in a two-dimensional horizontal array, a common upper electrode, and discrete dielectric layer patterns each interposed between a respective one of the lower electrodes of the fourth capacitors and the common upper electrode of the fourth capacitors, and a second pad in the form of a plate of electrically conductive material interposed between the substrate and the lower electrodes of the third and fourth capacitors, contacting the lower electrodes of the third and fourth capacitors, and spaced from the first pad, and wherein the first pad is also interposed between the substrate and the lower electrodes of the second capacitors, and contacts the lower electrodes of the second capacitors, the common upper electrode of the second capacitors comprises second vertical columns of electrically conductive material each extending upright in the first interlayer insulating layer and surrounded by a respective one of the dielectric layer patterns, and a layer of conductive material extending on the first interlayer insulating layer and connecting the second vertical columns of electrically conductive material to one another, the second vertical columns being arranged in a horizontal two-dimensional array in correspondence with the lower electrodes of the second capacitors, the common upper electrode of the third capacitors comprises third vertical columns of electrically conductive material each extending upright in the first interlayer insulating layer and surrounded by a respective one of the dielectric layer patterns, and a layer of conductive material extending on the first interlayer insulating layer and connecting the third vertical columns of electrically conductive material to one another, the third vertical columns being arranged in a horizontal two-dimensional array in correspondence with the lower electrodes of the third capacitors, the common upper electrode of the fourth capacitors comprises fourth vertical columns of electrically conductive material each extending upright in the first interlayer insulating layer and surrounded by a respective one of the dielectric layer patterns, and a layer of conductive material extending on the first interlayer insulating layer and connecting the fourth vertical columns of electrically conductive material to one another, the fourth vertical columns being arranged in a horizontal two-dimensional array in correspondence with the lower electrodes of the fourth capacitors, the layer of conductive material of the common upper electrode of the second capacitors is contiguous with the layer of conductive material of the common upper electrode of the third capacitors, and the first contact extends vertically in the second interlayer insulating layer between the first wiring and the layer of conductive material of the common upper electrode of the first capacitors, and the second contact extends vertically in the second interlayer insulating layer between the second wiring and the layer of conductive material of the common upper electrode of the fourth capacitors.

16. The semiconductor device of claim 13, wherein the array of capacitors constitutes a first capacitor array, the pad of electrically conductive material constitutes a first pad, and the capacitor structure further comprises:

second, third and fourth capacitor arrays, the second capacitor array including second capacitors each extending vertically in the first interlayer insulating layer in the second region, the second capacitors having respective discrete lower electrodes arranged in a two-dimensional horizontal array, a common upper electrode, and discrete dielectric layer patterns each interposed between a respective one of the lower electrodes of the second capacitors and the common upper electrode of the second capacitors, the third capacitor array including third capacitors each extending vertically in the first interlayer insulating layer in the second region, the third capacitors having respective discrete lower electrodes arranged in a two-dimensional horizontal array, a common upper electrode, and discrete dielectric layer patterns each interposed between a respective one of the lower electrodes of the third capacitors and the common upper electrode of the third capacitors, the fourth capacitor array including fourth capacitors each extending vertically in the first interlayer insulating layer in the second region, the fourth capacitors having respective discrete lower electrodes arranged in a two-dimensional horizontal array, a common upper electrode, and discrete dielectric layer patterns each interposed between a respective one of the lower electrodes of the fourth capacitors and the common upper electrode of the fourth capacitors, and a second pad in the form of a plate of electrically conductive material interposed between the substrate and the lower electrodes of the second and third capacitors, contacting the lower electrodes of the second and third capacitors, and spaced from the first pad in the first direction, and a third pad in the form of a plate of electrically conductive material interposed between the substrate and the lower electrodes of the fourth capacitors, contacting the lower electrodes of the fourth capacitors, and spaced from the first and second pads, and wherein the common upper electrode of the second capacitors comprises second vertical columns of electrically conductive material each extending upright in the first interlayer insulating layer and surrounded by a respective one of the dielectric layer patterns, and a layer of conductive material extending on the first interlayer insulating layer and connecting the second vertical columns of electrically conductive material to one another, the second vertical columns being arranged in a horizontal two-dimensional array in correspondence with the lower electrodes of the second capacitors, the common upper electrode of the third capacitors comprises third vertical columns of electrically conductive material each extending upright in the first interlayer insulating layer and surrounded by a respective one of the dielectric layer patterns, and a layer of conductive material extending on the interlayer insulating layer and connecting the third vertical columns of electrically conductive material to one another, the third vertical columns being arranged in a horizontal two-dimensional array in correspondence with the lower electrodes of the third capacitors, the common upper electrode of the fourth capacitors comprises fourth vertical columns of electrically conductive material each extending upright in the first interlayer insulating layer and surrounded by a respective one of the dielectric layer patterns, and a layer of conductive material extending on the interlayer insulating layer and connecting the fourth vertical columns of electrically conductive material to one another, the fourth vertical columns being arranged in a horizontal two-dimensional array in correspondence with the lower electrodes of the fourth capacitors, the layer of conductive material of the common upper electrode of the capacitors of the first capacitor array is contiguous with the layer of conductive material of the common upper electrode of the second capacitors, the layer of conductive material of the common upper electrode of the capacitors of the third capacitors is contiguous with the layer of conductive material of the common upper electrode of the fourth capacitors, the first contact extends vertically in the first and second interlayer insulating layers between the first wiring and the first pad, and the second contact extends vertically in the first and second interlayer insulating layers between the second wiring and the third pad.

17. The semiconductor device of claim 13, wherein the array of capacitors constitutes a first capacitor array, the pad of electrically conductive material constitutes a first pad, and the capacitor structure further comprises:

a second capacitor array spaced from the first capacitor array in a first direction, the second capacitor array including second capacitors each extending vertically in the first interlayer insulating layer in the second region, the second capacitors having respective discrete lower electrodes arranged in a two-dimensional horizontal array, a common upper electrode, and discrete dielectric layer patterns each interposed between a respective one of the lower electrodes of the second capacitors and the common upper electrode of the second capacitors, and wherein the first pad is also interposed between the substrate and the lower electrodes of the second capacitors, and contacts the lower electrodes of the second capacitors, the common upper electrode of the second capacitors comprises second vertical columns of electrically conductive material each extending upright in the first interlayer insulating layer and surrounded by a respective one of the dielectric layer patterns, and a layer of conductive material extending on the interlayer insulating layer and connecting the second vertical columns of electrically conductive material to one another, the second vertical columns being arranged in a horizontal two-dimensional array in correspondence with the lower electrodes of the second capacitors, the layer of conductive material of the common upper electrode of the first capacitors is spaced in the first direction from the layer of conductive material of the common upper electrode of the second capacitors, the first wiring and the second wiring comprise first and second linear segments of conductive material, respectively, each extending longitudinally in the first direction, the first contact is elongated in the first direction and extends between the linear segment of conductive material constituting the first wiring and the layer of conductive material of the common upper electrode of the first capacitors, and the second contact is elongated in the first direction and extends between the linear segment of conductive material constituting the second wiring and the layer of conductive material of the common upper electrode of the second capacitors.

18. The semiconductor device of claim 13, wherein the array of capacitors constitutes a first capacitor array, the pad of electrically conductive material constitutes a first pad, and the capacitor structure further comprises:

a second capacitor array, the second capacitor array including second capacitors each extending vertically in the first interlayer insulating layer in the second region, the second capacitors having respective discrete lower electrodes arranged in a two-dimensional horizontal array, a common upper electrode, and discrete dielectric layer patterns each interposed between a respective one of the lower electrodes of the second capacitors and the common upper electrode of the second capacitors, and a second pad in the form of a plate of electrically conductive material interposed between the substrate and the lower electrodes of the second capacitors, contacting the lower electrodes of the second capacitors, and spaced from the first pad, and wherein the common upper electrode of the second capacitors comprises second vertical columns of electrically conductive material each extending upright in the first interlayer insulating layer and surrounded by a respective one of the dielectric layer patterns, and a layer of conductive material extending on the first interlayer insulating layer and connecting the second vertical columns of electrically conductive material to one another, the second vertical columns being arranged in a horizontal two-dimensional array in correspondence with the lower electrodes of the second capacitors, the layer of conductive material of the common upper electrode of the first capacitors is contiguous with the layer of conductive material of the common upper electrode of the second capacitors, and the first contact extends vertically in the first and second interlayer insulating layers between the first wiring and the second pad, and the second contact extends vertically in the first and second interlayer insulating layers between the second wiring and the first pad.

19. The semiconductor device of claim 13, wherein the first and second wirings comprise first and second linear segments of wires, respectively, disposed at the same level as one another on the second interlayer insulating layer.

20. The semiconductor device of claim 13, further comprising a third interlayer insulating layer disposed on the substrate and interposed between the substrate and the capacitor structure, and wherein the pad of electrically conductive material is disposed on an upper surface of the third interlayer insulating layer and is embedded in the first interlayer insulating layer.

* * * * *